(12) United States Patent
Nunomura et al.

(10) Patent No.: US 7,851,128 B2
(45) Date of Patent: *Dec. 14, 2010

(54) PHOTOSENSITIVE POLYMER COMPOSITION, METHOD OF FORMING RELIEF PATTERNS, AND ELECTRONIC EQUIPMENT

(75) Inventors: Masataka Nunomura, Ibaraki (JP); Masayuki Ooe, Ibaraki (JP); Hajime Nakano, Ibaraki (JP); Yoshiko Tsumaru, Ibaraki (JP); Takumi Ueno, Ibaraki (JP)

(73) Assignees: Hitachi Chemical Dupont Microsystems Ltd., Tokyo (JP); Hitachi Chemical Dupont Microsystems L.L.C., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/605,262

(22) Filed: Nov. 29, 2006

(65) Prior Publication Data

US 2007/0072122 A1    Mar. 29, 2007

Related U.S. Application Data

(63) Continuation of application No. 10/440,301, filed on May 19, 2003, now Pat. No. 7,150,947.

(30) Foreign Application Priority Data

May 17, 2002  (JP)  ............................ 2002-143166
Mar. 14, 2003  (JP)  ............................ 2003-069898

(51) Int. Cl.
  *G03F 7/004*  (2006.01)
  *G03F 7/30*   (2006.01)

(52) U.S. Cl. ............. 430/270.1; 430/281.1; 430/287.1; 430/311; 430/326; 430/330

(58) Field of Classification Search ............. 430/270.1, 430/281.1, 311, 326, 330, 287.1
See application file for complete search history.

(56) References Cited

U.S. PATENT DOCUMENTS

| 5,114,826 | A | 5/1992 | Kwong et al. |
| 5,288,588 | A | 2/1994 | Yukawa et al. |
| 5,442,024 | A | 8/1995 | Kunimune et al. |
| 5,516,875 | A | 5/1996 | Simmons, III |
| 6,177,225 | B1 | 1/2001 | Weber et al. |
| 6,376,151 | B1 * | 4/2002 | Takahashi et al. ............ 430/192 |
| 6,436,593 | B1 | 8/2002 | Minegishi et al. |
| 6,600,006 | B2 * | 7/2003 | Jung et al. .................. 528/353 |
| 6,677,099 | B1 | 1/2004 | Ishii et al. |
| 6,875,554 | B2 | 4/2005 | Hatanaka et al. |
| 7,150,947 | B2 * | 12/2006 | Nunomura et al. ............ 430/18 |
| 2002/0048719 | A1 | 4/2002 | Jung et al. |

FOREIGN PATENT DOCUMENTS

| EP | 0 997 777 | 5/2000 |
| JP | 55-30207 | 8/1980 |
| JP | 1-46862 | 10/1989 |
| JP | 3-36861 | 6/1991 |
| JP | 04-120171 | 4/1992 |
| JP | 4-204945 | 7/1992 |
| JP | 11-202489 | 7/1999 |
| JP | P3015430 | 12/1999 |
| JP | 2001-166484 | 6/2001 |
| JP | 2001-192573 | 7/2001 |
| JP | 2002-169284 | 6/2002 |
| JP | 2002-284875 | 10/2002 |
| JP | 2002-356555 | 12/2002 |

OTHER PUBLICATIONS

Communication dated Nov. 11, 2003, and European Search Report completed on Nov. 4, 2003 for Appln. No. EP 03 01 1014.
Japanese Official Action for Application No. 2002-143166 mailed May 22, 2007.
Japanese Official Action for Application No. 2002-143166, dated Sep. 18, 2007.
Japanese Official Action dated Apr. 22, 2008, for Application No. 2003-069898.
Japanese Official Action dated Jul. 15, 2008, for Application No. 2003-069898.

* cited by examiner

*Primary Examiner*—John S Chu
(74) *Attorney, Agent, or Firm*—Antonelli, Terry, Stout & Kraus, LLP.

(57) ABSTRACT

A photosensitive polymer composition, having (a) a polymer selected from polyimide precursors and polyimides having an acid group protected by a protecting group and having no amino group (—NH$_2$) at the end; and (b) a compound that generates an acid when exposed to light and capable of deprotecting the protecting group from the acid group, is employed to form layers of a semiconductor device.

9 Claims, 1 Drawing Sheet

US 7,851,128 B2

PHOTOSENSITIVE POLYMER COMPOSITION, METHOD OF FORMING RELIEF PATTERNS, AND ELECTRONIC EQUIPMENT

This application is a Continuation application of application Ser. No. 10/440,301, filed May 19, 2003, now U.S. Pat. No. 7,150,947 the contents of which are incorporated herein by reference in their entirety.

BACKGROUND OF THE INVENTION

1) Field of the Invention

The present invention relates to a positive-tone photosensitive polymer composition, which is converted into a heat resistant polymer after curing, and applied to a passivation film, interlayer insulating film and the like for semiconductor devices in electronic equipments.

2) Description of the Related Art

Since polyimides have excellent heat resistance, good mechanical properties, they can be formed in films easily, their surface is relatively flat, and the like, the polyimides are widely used as passivation films or interlayer insulating films in semiconductor devices. In the semiconductor devices in which the polyimides are used as the passivation films or the interlayer insulating films, through-holes can be formed in the semiconductor devices by etching the semiconductor devices with a positive-tone photoresist. However, such etching is complicated because it involves applying the photoresist and peeling off the photoresist. Photosensitive heat resistant materials have been investigated as a means to obtain a better method of forming the through-holes.

The photosensitive heat resistant composition, which is usually in the form of a liquid, is applied onto the semiconductor substrate, dried, irradiated with active ray via a mask, and un-exposed area of the substrate is removed by a developer. This results in a formation of a pattern of the semiconductor substrate. The photosensitive heat resistant materials include, for example, following two compositions:

1) polyimide precursor composition in which a photosensitive group is introduced by ester bonding (see Japanese Patent Application Publication No. 55-30207), and
2) composition prepared by adding a compound containing a carbon-carbon double bond dimeriazable or polymerizable by chemical ray to a polyamic acid, an amino group, and an aromatic bisazide (see Japanese Patent Application Publication No. 3-36861.

However, both the above-mentioned compositions have negative-tone, and an organic solvent is used in the development process during pattern formation. Therefore, there is a problem that the arrangement that performs the masking and development is need to be changed when switching from an etching process using a positive-tone photoresist to a negative-tone photosensitive heat resistant material and vice versa.

Therefore, positive-tone photosensitive heat resistant compositions developable with an alkali aqueous solution has been investigated. Following two positive-tone photosensitive heat resistant compositions, for example, have been reported:

1) composition containing a polyamic acid ester containing a phenolic hydroxyl group and an o-quinonediazide compound (see Japanese Patent Application Laid-Open No. 4-204945), and
2) composition containing a polybenzoxazole precursor and an o-quinonediazide compound (Japanese Patent Application Laid-Open No. 1-46862).

Thus, both of the above-mentioned compositions include the o-quinonediazide compound as a photosensitive agent. However, the o-quinonediazide compound has a problem that it absorbs the exposure wavelengths. Therefore, there is a problem with the above-mentioned two positive-tone photosensitive heat resistant compositions that their sensitivity is low when they are formed in thick films.

There is a report (see Japanese Patent No. 3015430) on a composition containing a polymer prepared by protecting carboxyl groups of a polyamic acid and a compound generating an acid by irradiation. This composition is theoretically supposed to be high sensitivity because acids generated by irradiation can de-protect a protected carboxyl group several times. However, in reality the sensitivity is low, and it is not practical to employ this composition.

Some of the semiconductor device structures require that the temperature be low during the heat-treatment for converting a polyimide precursor into a polyimide. However, conventional materials have a problem that if the temperature during the heat-treatment is low, the polyimide does not spread effectively.

SUMMARY OF THE INVENTION

It is an object of the present invention to solve at least the problems in the conventional technology.

The photosensitive polymer composition according to the present invention includes (a) a polymer selected from polyimide precursors and polyimides having an acid group protected by a protecting group and having no amino group (—$NH_2$) at the end; and (b) a compound that generates an acid when exposed to light and capable of deprotecting the protecting group from the acid group.

The method of forming a relief pattern according to another aspect of the present invention includes applying the photosensitive polymer composition according to the present invention on a substrate to thereby form a film of the photosensitive polymer composition on the substrate; drying the film; exposing the film to light; heating, if necessary, the film; developing the film; and curing the film.

The electronic equipment according to still another aspect of the present invention includes an electronic device that has at least an interlayer insulating film layer and a passivation film layer. At least one of the interlayer insulating film layer and the passivation film layer is a layer with the relief pattern formed by the method of forming a relief pattern according to the present invention.

The other objects, features and advantages of the present invention are specifically set forth in or will become apparent from the following detailed descriptions of the invention when read in conjunction with the accompanying drawings.

DETAILED DESCRIPTION

Figure 1A:
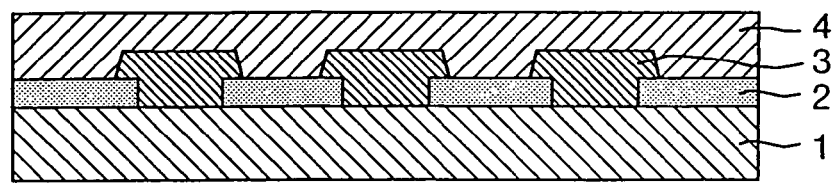
FIG. 1A to FIG. 1E illustrate how a semiconductor device having a multi-layered interconnection structure is fabricated.

A photosensitive polymer according to the present invention includes (a) a polymer selected from polyimide precursors and polyimides; and (b) a compound that generates an acid when exposed to light and capable of deprotecting the protecting group from the acid group. Moreover, the polymer (a) is characterized in that it has substantially no amino group (—$NH_2$) at the end, and that it has an acid group protected by a protecting group.

The component (a) in the present invention is a polymer selected from polyimide precursors and polyimides. In the present invention, the polymer contains an acid group such as a phenolic hydroxyl group and carboxyl group and the like protected by a protecting group such as a tetrahydropyranyl group, and an alkoxymethyl group and the like.

Since an acid is generated when the component is exposed to light, a de-protecting reaction of the component (a) occurs, and the number of acid groups in the component (a) increases in the area that is exposed to light (hereinafter, "exposed area"). For accelerating the de-protecting reaction, heating may be conducted if necessary. Since the dissolution rate of exposed area increases to an alkali aqueous solution used as a developer with comparison to the dissolution rate of unexposed area, a relief pattern can be defined. Here, the alkali aqueous solution is an alkaline solution and me be prepared by dissolving tetramethylammonium hydroxide, metal hydroxide, amine and the like in water.

When a basic group is present, the basic group and the acid generated when the component (b) is exposed to light produce a salt, and efficiency of a de-protecting reaction of the component (a) becomes lower. In general, polyimide precursors and polyimides are produced using a diamine and tetracarboxylic dianhydride as raw materials, therefore, one end or both ends of a polymer chain often carry an amino group. However, since the component (a) in the present invention contains substantially no amino group at both ends of a polymer chain, a de-protecting reaction is not disturbed and, as a result, sensitivity increases. Further, sensitivity lowers when there are free amino groups in the composition, amino groups other than amino groups on both ends of a polymer in the component (a), or a reactive protecting group on the end of a polymer in the component (a), therefore, it is preferable that these groups are not present.

The component (a) forms a heat resistant passivation film or interlayer insulating film by heat-treatment after formation of a relief pattern. In order to increase reliability of a semiconductor device, it is necessary that a polyimide film elongates (or spreads) to a certain extent. Though the action is unknown, use of a polyimide precursor of the general formula (I) in which $R^1$ represents an aliphatic group is preferable since excellent sensitivity is obtained and even if the temperature of heat-treatment into a polyimide is lowered, elongation is good.

It is preferable that the component (a) is a polyimide precursor or polyimide containing substantially no amino group at the end, containing substantially no reactive protecting group at the end and containing a protected acid group, and containing a repeating structure of the general formula (I) or (II). Here, the term "substantially" means, in general, that an amino group is not present at all or present only to an extent not detectable by $^1$H-NMR in the whole polymer.

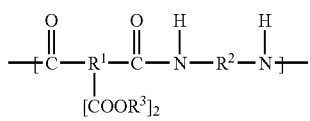

(I)

where $R^1$ represents a tetra-valent organic group, $R^2$ represents a di-valent organic group, and two $R^3$s represent each independently a hydrogen atom or a mono-valent organic group, and

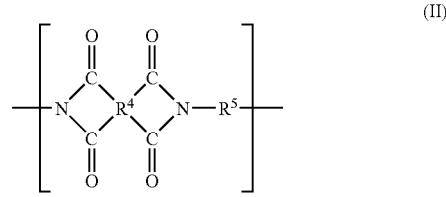

(II)

where $R^4$ represents a tetra-valent organic group, and $R^5$ represents a di-valent organic group.

The acid group protected by a protecting group compound obtained by converting an acid group such as a phenolic hydroxyl group, a carboxyl group and the like into a group containing a structure of acetal, ketal, ester and the like.

The reactive protecting group is the group that can form cross-linkage in heat-treatment into a polyimide, and specific examples thereof include groups containing a carbon-carbon double bond, and the like.

The tetra-valent organic group represented by $R^1$ in the general formula (I) is generally a residual group of a tetracarboxylic acid, di-anhydride thereof, or derivatives thereof that can react with a diamine to form a structure of a polyimide precursor, and preferable are tetra-valent aromatic groups and aliphatic groups, and more preferable are those having 4 to 40 carbon atoms.

As the tetra-valent aromatic group, those in which all four bonding portions are present on an aromatic ring are preferable for a positive-tone photosensitive polymer composition excellent in film physical properties. These bonding portions are classified into two sets of two bonding portions, and it is preferable that two bonding portions are situated at ortho position or peri position of an aromatic ring. The two sets may be present on the same aromatic ring, or on separate aromatic rings bonded via various bonds such as, for example, a single bond, —O—, —$SO_2$—, —$CO_2$—, —$C(CF_3)_2$— and the like. $R^1$ may contain, if necessary, an acid group such as a phenolic hydroxyl group, carboxyl group and the like or a protected acid group.

Of tetra-valent organic groups represented by $R^1$, aliphatic groups are preferable since a positive-tone photosensitive polymer composition is obtained showing excellent sensitivity even if the film thickness is large, further, giving excellent elongation of a film even if the temperature of heat-treatment into a polyimide is lowered. The aliphatic group may have a ring structure. Unless four bonding portions are present on an aromatic ring (benzene ring, naphthalene ring and the like), those containing an aromatic ring structure are also included in the definition of the aliphatic group referred in the present invention. The aliphatic group $R^1$ may, if necessary, contain an acid group such as a phenolic hydroxyl group, carboxyl group and the like or a protected acid group.

The di-valent organic group represented by $R^2$ in the general formula (I) is generally a residual group obtained by removing an amino group of a diamine, that can react with a tetra-carboxylic acid, di-anhydride thereof or derivative thereof to form a structure of a polyimide precursor, and preferable are di-valent aromatic groups and aliphatic groups, and more preferable are those having 2 to 40 carbon atoms, further preferable are aromatic groups having 6 to 40 carbon atoms. Here, as the aromatic group, those in which two bonding portions are present on an aromatic ring are preferable, and in this case, two bonding portions may be present on the same aromatic ring, or on different aromatic rings. The aliphatic group may have a ring structure. If necessary, $R^2$ may contain an acid group such as a phenolic hydroxyl group, carboxyl group and the like or a protected acid group.

In the general formula (I), $R^3$ is a hydrogen atom or a mono-valent organic group, and as the mono-valent organic group, those having 1 to 20 carbon atoms are preferable.

Photosensitive polymers in which 50% or more of all repeating units constituting a polyimide precursor in the general formula (I) (when other repeating units than the polyimide precursor are contained, the are also included, of course) are repeating units of the general formula (I) are preferable from the standpoints of a photosensitive property, and the like.

The tetra-valent organic group represented by $R^4$ in the general formula (II) is a residual group of a tetra-carboxylic acid, di-anhydride thereof, or derivatives thereof that can react with a diamine to form a structure of a polyimide precursor, and preferable are tetra-valent aromatic groups and aliphatic groups, more preferable are those having 4 to 40 carbon atoms, and further preferable are tetra-valent aromatic groups having 6 to 40 carbon atoms. As the tetra-valent aromatic group, those in which all four bonding portions are present on an aromatic ring are preferable. These bonding portions are classified into two sets of two bonding portions, and it is preferable that two bonding portions are situated at ortho position or peri position of an aromatic ring. The two sets may be present on the same aromatic ring, or on separate aromatic rings bonded via various bonds such as, for example, a single bond, —O—, —SO$_2$—, —CO$_2$—, —C(CF$_3$)$_2$— and the like. $R^4$ may contain, if necessary, an acid group such as a phenolic hydroxyl group, carboxyl group and the like or a protected acid group.

Of tetra-valent organic groups represented by $R^4$, aliphatic groups are preferable since excellent sensitivity is shown even if the film thickness is large. The aliphatic group may have a ring structure. Unless four bonding portions are present on an aromatic ring (benzene ring, naphthalene ring and the like), those containing an aromatic ring structure are also included in the definition of the aliphatic group referred in the present invention. The aliphatic group $R^4$ may, if necessary, contain an acid group such as a phenolic hydroxyl group, carboxyl group and the like or a protected acid group.

The di-valent organic group represented by $R^5$ in the general formula (II) is a residual group obtained by removing an amino group of a diamine, that can react with a tetra-carboxylic acid, di-anhydride thereof or derivative thereof to form a structure of a polyimide precursor, and preferable are aromatic groups and aliphatic groups, and more preferable are those having 2 to 40 carbon atoms, further preferable are aromatic groups having 6 to 40 carbon atoms. Here, as the aromatic group, those in which two bonding portions are present on an aromatic ring are preferable, and in this case, two bonding portions may be present on the same aromatic ring, or on separate aromatic rings bonded via various bonds such as, for example, a single bond, —O—, —SO$_2$—, —CO$_2$—, —C(CF$_3$)$_2$— and the like. $R^5$ may contain, if necessary, an acid group such as a phenolic hydroxyl group, carboxyl group and the like or a protected acid group.

When the component (a) has a repeating structure of the general formula (I), it is preferable that 50% or more repeating structures of the general formula (I) are contained. Those which may be contained, other than that of the general formula (l), are repeating structures of the general formula (II), further, the following general formulae (VIII), (IX), (X), (XI) and (XII):

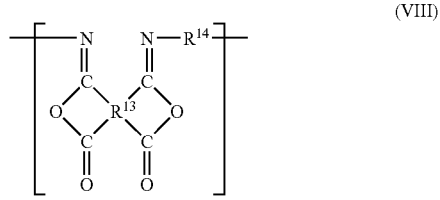

(where $R^{13}$ represents a tetra-valent organic group, and $R^{14}$ represents a di-valent organic group);

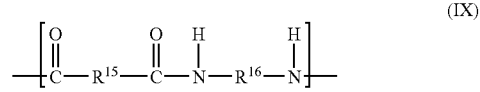

where $R^{15}$ represents a di-valent organic group, and $R^{16}$ represents a di-valent organic group;

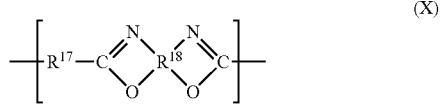

where $R^{17}$ represents a di-valent organic group, and $R^{18}$ represents a tetra-valent organic group;

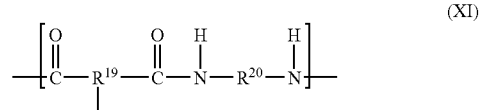

where $R^{19}$ represents a tri-valent organic group, $R^{20}$ represents a di-valent organic group, and $R^{21}$ represents a hydrogen atom or mono-valent organic group; and

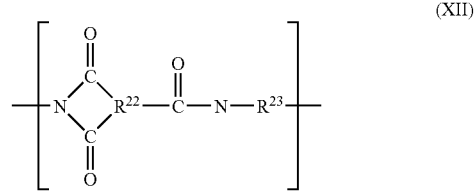

where $R^{22}$ represents a tri-valent organic group, and $R^{23}$ represents a di-valent organic group.

The tetra-valent organic group represented by $R^{13}$ in the general formula (VIII) is a residual group of a tetra-carboxylic acid, di-anhydride thereof, or a derivative thereof that can react with a diamine to form a structure of a polyimide precursor, and preferable are tetra-valent aromatic groups and aliphatic groups, more preferable are those having 4 to 40 carbon atoms, and further preferable are tetra-valent organic groups having 6 to 40 carbon atoms. As the tetra-valent aromatic group, those in which all four bonding portions are present on an aromatic ring are preferable. These bonding portions are classified into two sets of two bonding portions, and it is preferable that two bonding portions are situated at ortho position or peri position of an aromatic ring. The two sets may be present on the same aromatic ring, or on separate aromatic rings bonded via various bonds such as, for example, a single bond, —O—, —$SO_2$—, —$CO_2$—, —$C(CF_3)_2$— and the like. $R^{13}$ may contain, if necessary, an acid group such as a phenolic hydroxyl group, carboxyl group and the like or a protected acid group.

The di-valent organic group represented by $R^{14}$ in the general formula (VII) is a residual group obtained by removing an amino group of a diamine, that can react with a tetra-carboxylic acid, di-anhydride thereof, or a derivative thereof to form a structure of a polyimide precursor, and preferable are di-valent aromatic groups and aliphatic groups, more preferable are those having 2 to 40 carbon atoms, and further preferable are aromatic groups having 6 to 40 carbon atoms. Here, as the aromatic group, those in which two bonding portions are present on an aromatic ring are preferable, and in this case, the two bonding portions may be present on the same aromatic ring, or on separate aromatic rings bonded via various bonds such as, for example, a single bond, —O—, —$SO_2$—, —$CO_2$—, —$C(CF_3)_2$— and the like. $R^{14}$ may contain, if necessary, an acid group such as a phenolic hydroxyl group, carboxyl group and the like or a protected acid group. When a phenolic hydroxyl group is present on the ortho position of an amino group, an oxazole ring can be formed by heating.

The di-valent organic group represented by $R^{15}$ in the general formula (IX) is a residual group of a di-carboxylic acid, or a derivative thereof that can react with a diamine to form a structure of a polyamide, and preferable are aromatic groups and aliphatic groups, more preferable are those having 2 to 40 carbon atoms, and further preferable are di-valent aromatic groups having 6 to 40 carbon atoms. Here, as the aromatic group, those in which two bonding portions are present on an aromatic ring are preferable, and in this case, the two bonding portions may be present on the same aromatic ring, or on separate aromatic rings bonded via various bonds such as, for example, a single bond, —O—, —$SO_2$—, —$CO_2$—, —$C(CF_3)_2$— and the like. $R^{15}$ may contain, if necessary, an acid group such as a phenolic hydroxyl group, carboxyl group and the like or a protected acid group.

The di-valent organic group represented by $R^{16}$ in the general formula (IX) is a residual group obtained by removing an amino group of a diamine, that can react with a di-carboxylic acid, or a derivative thereof to form a structure of a polyamide, and preferable are aromatic groups and aliphatic groups, more preferable are those having 2 to 40 carbon atoms, and further preferable are di-valent aromatic groups having 6 to 40 carbon atoms. Here, as the aromatic group, those in which two bonding portions are present on an aromatic ring are preferable, and in this case, the two bonding portions may be present on the same aromatic ring, or on separate aromatic rings bonded via various bonds such as, for example, a single bond, —O—, —$SO_2$—, —$CO_2$—, —$C(CF_3)_2$— and the like. $R^{16}$ may contain, if necessary, an acid group such as a phenolic hydroxyl group, carboxyl group and the like or a protected acid group. When a phenolic hydroxyl group is present on the ortho position of an amino group, an oxazole ring can be formed by heating.

The di-valent organic group represented by $R^{17}$ in the general formula (X) is a residual group of a di-carboxylic acid or derivatives thereof, that can react with a diamine having a phenolic hydroxyl group to form a structure of polybenzoxazole, and preferable are aromatic groups and aliphatic groups, more preferable are those having 2 to 40 carbon atoms, and further preferable are aromatic groups, and an acid group such as a phenolic hydroxyl group and the like may be contained. Here, as the aromatic group, those in which two bonding portions are present on an aromatic ring are preferable, and in this case, the two bonding portions may be present on the same aromatic ring or on different aromatic rings. $R^{17}$ may contain, if necessary, an acid group such as a phenolic hydroxyl group, carboxyl group and the like or a protected acid group.

The tetra-valent organic group represented by $R^{18}$ in the general formula (X) is a residual group of a diamine having a phenolic hydroxyl group, that can react with a di-carboxylic acid or derivatives thereof to form a structure of polybenzoxazole, and preferable are tetra-valent aromatic groups and aliphatic groups, more preferable are those having 4 to 40 carbon atoms, and further preferable are tetra-valent aromatic groups having 6 to 40 carbon atoms. As the tetra-valent aromatic group, those in which all four bonding portions are present on an aromatic ring are preferable. Those in which a set of a bonding portion to a nitrogen atom and a bonding portion to an oxygen atom are situated on the ortho position of an aromatic ring are preferable. A set of a bonding portion to a nitrogen atom and a bonding portion to an oxygen atom may be present on the same aromatic ring as another set of bonding portions. They may be present, for example, on separate aromatic rings bonded via various bonds such as, for example, a single bond, —O—, —$SO_2$—, —$CO_2$—, —$C(CF_3)_2$— and the like. $R^{18}$ may contain, if necessary, an acid group such as a phenolic hydroxyl group, carboxyl group and the like or a protected acid group.

The tri-valent organic group represented by $R^{19}$ in the general formula (XI) is a residual group of a tri-carboxylic acid or derivatives thereof, that can react with a diamine to form a structure of a polyamideimide precursor, and preferable are tri-valent aromatic groups and aliphatic groups, more preferable are those having 4 to 40 carbon atoms, and further preferable are tri-valent aromatic groups having 6 to 40 carbon atoms. As the tri-valent aromatic group, those in which all three bonding portions are present on an aromatic ring are preferable. Preferable are those in which two bonding portions, of those binding portions, are present on the ortho position of an aromatic ring. Further, $R^{19}$ may contain, if necessary, an acid group such as a phenolic hydroxyl group, carboxyl group and the like or a protected acid group.

The di-valent organic group represented by $R^{20}$ in the general formula (XI) is a residual group obtained by removing an amino group of a diamine, that can react with a tri-carboxylic acid, or derivatives thereof to form a structure of a polyamideimide precursor, and preferable are aromatic groups and aliphatic groups, more preferable are those having 2 to 40 carbon atoms, and further preferable are di-valent aromatic groups having 6 to 40 carbon atoms, and an acid group such as a phenolic hydroxyl group, carboxyl group and the like may be contained. Here, as the aromatic group, those in which two bonding portions are present on an aromatic ring are preferable, and in this case, two bonding portions may be present on the same aromatic ring, or on separate aromatic rings bonded via various bonds such as, for example, a single bond, —O—, —$SO_2$—, —$CO_2$—, —$C(CF_3)_2$— and the like.

Further, $R^{20}$ may contain, if necessary, an acid group such as a phenolic hydroxyl group, carboxyl group and the like or a protected acid group.

The mono-valent organic group $R^{21}$ in the general formula (XI) is a mono-valent organic group preferably having 1 to 20 carbon atoms.

The tri-valent organic group represented by $R^{22}$ in the general formula (XII) is a residual group of a tri-carboxylic acid or derivatives thereof, that can react with a diamine to form a structure of a polyamideimide, and preferable are tri-valent aromatic groups and aliphatic groups, more preferable are those having 4 to 40 carbon atoms, and further preferable are tri-valent aromatic groups having 6 to 40 carbon atoms. As the tri-valent aromatic group, those in which all three bonding portions are present on an aromatic ring are preferable. Preferable are those in which two bonding portions, of those binding portions, are present on the ortho position of an aromatic ring. Further, $R^{22}$ may contain, if necessary, an acid group such as a phenolic hydroxyl group, carboxyl group and the like or a protected acid group.

The di-valent organic group represented by $R^{23}$ in the general formula (XII) is a residual group obtained by removing an amino group of a diamine, that can react with a tri-carboxylic acid, or derivatives thereof to form a structure of a polyamideimide, and preferable are aromatic groups and aliphatic groups, more preferable are those having 2 to 40 carbon atoms, and further preferable are aromatic groups. Here, as the aromatic group, those in which two bonding portions are present on an aromatic ring are preferable, and in this case, the two bonding portions may be present on the same aromatic ring, or on different aromatic rings. Further, $R^{23}$ may contain, if necessary, an acid group such as a phenolic hydroxyl group, carboxyl group and the like or a protected acid group.

When the component (a) has a repeating structure of the general formula (II), it is preferable that 50% or more repeating structures of the general formula (II) are contained. As other repeating structures other than that of the general formula, structures of the general formulae (I), (VIII), (IX), (X), (XI), and (XII) may be contained.

The component (a) in the present invention contains substantially no amino group, and instead, a protected amino group is preferably contained as the end group. Particularly, when the component (a) is synthesized using excess moles of the diamine component than the acid component or synthesized using both components of approximately the same amount, an amino group is often contained on the end, therefore, this can be protected to give a condition containing substantially no amino group. Here, the protected amino group represents that obtained by converting an amino group into a group containing a structure of an amide, sulfonic amide and the like. The aid component means a sum of components acting as acid residues present in a polymer, and when those other than tetracarboxylic acids or derivatives thereof, for example, di-carboxylic acids, tri-carboxylic acids or derivatives thereof are partially used, it means a total number including them are meant.

In general, the component (a) is preferably synthesized using excess moles of acid component than the diamine component. In this case, the component (a) generally carries a residual group of an acid component on both ends, and further when the end is composed of an imide-ring-closable protecting group, a positive-tone photosensitive polymer composition performing effects of excellent elongation of a film, and the like even if the temperature of heat-treatment into a polyimide is lowered is preferably obtained. The protecting group having an imide-ring-closable end can be formed, for example, by using a monoamine in addition to a diamine and making one of two carboxyl groups present on a residual group of an acid component on the end into an amide group.

As the component (a), those of the general formula (III) or (IV) are also preferable. In the general formula (III), $R^1$, $R^2$ and $R^3$ are as defined in the general formula (I). $R^6$ represents a hydrogen atom or a mono-valent organic group, and those having 1 to 20 carbon atoms are more preferable as the mono-valent organic group. $R^7$ represents a mono-valent organic group, and those having 1 to 20 carbon atoms are preferable. m represents an integer of 1 or more.

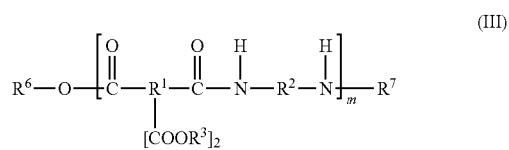

(III)

where $R^1$ represents a tetra-valent organic group, $R^2$ represents a di-valent organic group, two $R^3$s represent each independently a hydrogen atom or a mono-valent organic group, $R^6$ represents a hydrogen atom or a mono-valent organic group, $R^7$ represents a mono-valent organic group, and m represents an integer of 1 or more.

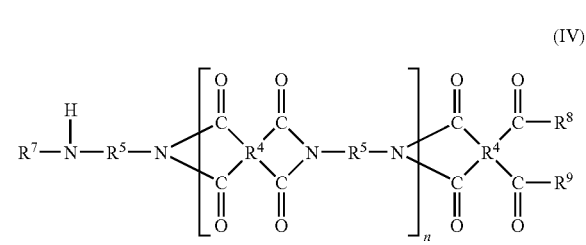

(IV)

where $R^4$ represents a tetra-valent organic group, $R^5$ represents a di-valent organic group, $R^7$ represents a mono-valent organic group, $R^8$ and $R^9$ represent a hydroxy group or a mono-valent alkoxy group or $R^8$ and $R^9$ represent that they are bonded to form —O—, and n represents an integer of 1 or more.

In the general formula (III), repeating units of the general formulae (II), (VIII), (IX), (X), (XI) or (XII) may be contained in a ratio of less than 50%.

In the general formula (IV), $R^4$ and $R^5$ are as defined in the general formula (II). $R^7$ is as defined in the general formula (III). $R^8$ and $R^9$ represent a hydroxy group, a mono-valent alkoxy group or a bonded —O—, and as the mono-valent alkoxy group, those having 1 to 20 carbon atoms are more preferable. n represents an integer of 1 or more.

In the general formula (IV), repeating units of the general formulae (I), (VIII), (IX), (X), (XI) or (XII) may be contained in a ratio of less than 50%.

When the component (a) has a protected amino group, it is preferable that detaching of a protecting group can be caused by heat-treatment at 400° C. or less. Further, it is preferable that the protected amino group is represented by the general formulae (V), (VI) and (VII):

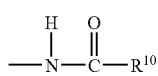

where $R^{10}$ represents a mono-valent organic group,

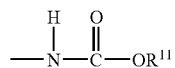

where $R^{11}$ represents a mono-valent organic group,

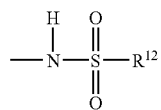

where $R^{12}$ represents a mono-valent organic group.

In the general formula (V), $R^{10}$ represents a mono-valent organic group, and those having 1 to 20 carbon atoms are preferable. In the general formula (VI), $R^{11}$ represents a mono-valent organic group, and those having 1 to 20 carbon atoms are preferable, and of them, hydrocarbon groups are preferable. In the general formula (VII), $R^{12}$ represents a mono-valent organic group, and those having 1 to 20 carbon atoms are preferable, and of them, hydrocarbon groups are preferable.

In the component (a), the protected acid group preferably contains a tetrahydropyranyl group, alkoxymethyl group, alkoxyethyl group, tert-butoxycarbonyl group or tert-butyl ester group.

The molecular weight of the component (a) is preferably between 2,000 and 200,000, more preferably between 4,000 and 100,000, in terms of weight-average molecular weight. The molecular weight is measured by gel permeation chromatography, and converted using a standard polystyrene calibration curve to obtain an intended value.

In the present invention, the component (a) can be synthesized by various methods. For example, the component (a) can be obtained by reacting a tetracarboxylic acid diester dihalide (chloride, bromide and the like) with a diamine having an acid group such as a phenolic hydroxyl group, carboxyl group and the like, further, if necessary, with a diamine having no acid group, then, protecting the acid group. In this case, it is preferable that a part of amino groups of a diamine is protected or the number of moles of a tetracarboxylic acid diester dihalide used is increased. The reaction of a tetracarboxylic acid diester dihalide with an acid group such as a phenolic hydroxyl group, carboxyl group and the like is preferably conducted in an organic solvent in the presence of a de-halogen acid agent.

As the tetracarboxylic acid diester dihalide, a tetracarboxylic acid diester dichloride is preferable. The tetracarboxylic acid diester dichloride can be obtained by reacting thionyl chloride with a tetracarboxylic acid diester obtained by reacting a tetracarboxylic acid dianhydride with an alcohol compound.

Preferable as the tetracarboxylic acid dianhydride are aromatic tetracarboxylic acid dianhydrides such as, for example, pyromellitic dianhydride, 3,3',4,4'-biphenyltetracarboxylic acid dianhydride, 2,3,3',4'-biphenyltetracarboxylic acid dianhydride, 2,2',3,3'-biphenyltetracarboxylic acid dianhydride, 3,3',4,4'-benzophenonetetracarboxylic acid dianhydride, 3,3',4,4'-biphenyl ether tetracarboxylic acid dianhydride, 3,3',4,4'-diphenylsulfone tetracarboxylic acid dianhydride, 1,2,3,4-cyclopentanetetracarboxylic acid dianhydride, 1,2,5,6-naphthalenetetracarboxylic acid dianhydride, 2,3,6,7-naphthalenetetracarboxylic acid dianhydride, 1,4,5,8-naphthalenetetracarboxylic acid dianhydride, 2,3,5,6-pyridinetetracarboxylic acid dianhydride, 3,4,9,10-perylenetetracarboxylic acid dianhydride, 3,3',4,4'-tetraphenylsilanetetracarboxylic acid dianhydride, 2,2-bis(3,4-dicarboxyphenyl)hexafluoropropane dianhydride and the like, and these can be used singly or in combination of two or more. Further, there can also be used those obtained by, for example, reacting 2 moles of anhydrous trimellitic chloride with 1 mole of a diamine having a phenolic hydroxyl group such as bis(3-amino-4-hydroxypheyl)hexafluoropropane and the like.

Of the tetracarboxylic acid dianhydrides, preferable as aliphatic tetracarboxylic acid dianhydrides are, for example, butane-1,2,3,4-tetracarboxylic acid dianhydride, cyclobutane-1,2,3,4-tetracarboxylic acid dianhydride, cyclopentane-1,2,3,4-tetracarboxylic acid dianhydride, cyclohexane-1,2,4,5-tetracarboxylic acid dianhydride, norbornane-2,3,5,6-tetracarboxylic acid dianhydride, bicyclo[2.2.2]oct-7-ene-3,4,8,9-tetracarboxylic acid dianhydride, tetracyclo[4.4.1.0$^{2,5}$.0$^{7,10}$]undecane-1,2,3,4-tetracarboxylic acid dianhydride, 5-(2,5-diketotetrahydrofurfuryl)-3-methyl-3-cyclohexyl-1,2-dicarboxylic acid anhydride, 2-norborneneacetic acid-3,5,6-tricarboxylic acid dianhydride, spiro[furane-3(2H), 6'-[3]oxabicyclo[3.2.1]octane]-2,2',4',5(4H)-tetrone, compounds of the general formulae (XIII), (XIV), (XV), and (XVI):

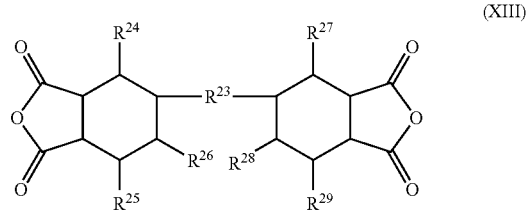

where $R^{23}$ represents a single bond, —O—, —SO$_2$—, —CO$_2$—, —C(CF$_3$)$_2$—, and $R^{24}$, $R^{25}$, $R^{26}$, $R^{27}$, $R^{28}$, and $R^{29}$ represent a hydrogen atom or a mono-valent organic group,

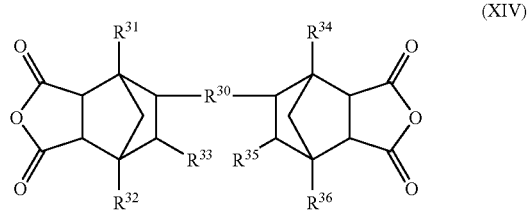

where $R^{30}$ represents a single bond, —O—, —SO$_2$—, —CO$_2$—, —C(CF$_3$)$_2$—, and $R^{31}$, $R^{32}$, $R^{33}$, $R^{34}$, $R^{35}$, and $R^{36}$ represent a hydrogen atom or a mono-valent organic group,

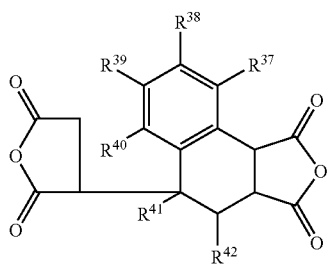

where $R^{37}$, $R^{38}$, $R^{39}$, $R^{40}$, $R^{41}$ and $R^{42}$ represent a hydrogen atom or a mono-valent organic group, and

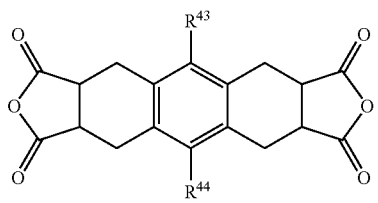

where $R^{43}$ and $R^{44}$ represent a hydrogen atom or a mono-valent organic group), and these can be used singly or in combination of two or more.

The alcohol used as a raw material of the tetracarboxylic acid diester are preferably, for example, the following alcohols. That is, alkyl alcohols such as methanol, ethanol, n-propyl alcohol, isopropyl alcohol, n-butyl alcohol, sec-butyl alcohol, tert-butyl alcohol, isobutyl alcohol, 1-pentanol, 2-pentanol, 3-pentanol, isoamylalcohol, 1-hexanol, 2-hexanol, 3-hexanol and the like, phenol, benzyl alcohol. Moreover, a combination of two or more of these alcohols may be used.

The tetracarboxylic acid diester compound may also be synthesized by mixing a tetracarboxylic acid dianhydride and the alcohol compound in an organic solvent in the presence of a base. The preferable ratio (mole ratio) of the tetracarboxylic acid dianhydride to alcohol compound (former/latter) is between 1/2 and 1/2.5, and the most preferable ratio is 1/2. The preferable ratio (mole ratio) of the tetracarboxylic acid dianhydride to base (former/latter) is between 1/0.001 and 1/3, the more preferable ration is between 1/0.005 and 1/2. This reaction temperature is preferably between 10 and 60° C., and the reaction time is preferably between 3 and 24 hours.

The tetracarboxylic acid diester dichloride may be synthesized using known methods. The tetracarboxylic acid diester dichloride may be synthesized, for example, by adding thionyl chloride drop-by-drop into and reacting thionyl chloride with a dicarboxylic acid or tetracarboxylic acid diester dissolved in an organic solvent. The preferable ratio of the dicarboxylic acid or-tetracarboxylic acid diester to thionyl chloride (former/latter) is between 1/1.1 and 1/2.5, and the more preferable ration is between 1/1.4 and 1/2.2. The reaction temperature is preferably between −20° C. and 40° C., and the reaction time is preferably between 1 and 10 hours.

The diamine having an acid group is an aromatic diamine having a phenolic hydroxyl group. The diamine may be, for example, any one the following. That is 1,3-diamino-4-hydroxybenzene, 1,3-diamino-5-hydroxybenzene, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, bis(3-amino-4-hydroxyphenyl)ether, bis(4-amino-3-hydroxyphenyl)ether, bis(3-amino-4-hydroxyphenyl)hexafluoropropane, bis(4-amino-3-hydroxyphenyl)hexafluoropropane. A combination of two or more of these compounds may be used as the.

Further, diamines having a carboxyl group may be used as the diamine. The diamines having a carboxyl group are, for example, 2,5-diaminobenzoic acid, 3,4-diaminobenzoic acid, 3,5-diaminobenzoic acid, 2,5-diaminoterephthalic acid, bis (4-amino-3-carboxyphenyl)methylene, bis(4-amino-3-carboxyphenyl)ether, 4,4'-diamino-3,3'-dicarboxybiphenyl, 4,4'-diamino-5,5'-dicarboxy-2,2'-dimethylbiphenyl. A combination of two or more these compounds may be used as the diamine.

The diamines having no acid group are, for example, aromatic diamine compounds such as 4,4'-diaminodiphenyl ether, 3,4'-diaminodiphenyl ether, 4,4'-diaminodiphenylmethane, 4,4'-diaminodiphenylsulfone, 3,3'-diaminodiphenylsulfone, 4,4'-diaminodiphenyl sulfide, benzidine, m-phenylenediamine, p-phenylenediamine, 1,5-naphthalenediamine, 2,6-naphthalenediamine, bis(4-aminophenoxyphenyl)propane, bis(3-aminophenoxyphenyl)propane, bis(4-aminophenoxyphenyl)sulfone, bis(3-aminophenoxyphenyl)sulfone, bis(4-aminophenoxy)biphenyl, bis[4-(4-aminophenoxy)phenyl]ether, 1,4-bis(4-aminophenoxy)benzene, 2,2-bis(3-amino-4-methylphenyl)hexafluoropropane, 2,2-bis(4-aminophenyl)hexafluoropropane, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 2,2',3,3'-tetraethyl-4,4'-diaminobiphenyl, 2,2'-dimethoxy-4,4'-diaminobiphenyl, 3,3'-dimethoxy-4,4'-diaminobiphenyl, 2,2'-di(trifluoromethyl)-4,4'-diaminobiphenyl and the like, and 1,3-bis(3-aminopropyl)tetramethyldisiloxane. A combination of two or more of these compounds may be used as the diamine having no acid group.

The diamine having a phenolic hydroxyl group, the diamine having a carboxyl group and the diamine having no acid group can be used in combination of two or more.

When the component (a) contains a protected amino group, it is preferable that a part of diamines is reacted with a protecting agent such as acetyl chloride, propionyl chloride, butylyl chloride, methyl chloroglyoxylate, ethyl chloroglyoxylate, methyl chloroformate, ethyl chloroformate, propyl chloroformate, butyl chloroformate, benzyl chloroformate, phenyl chloroformate, di-tert-butyl dicarbonate, benzenesulfonic chloride, p-tolueuesulfonic chloride, methanesulfonic chloride, ethansulfonic chloride, chloromethyl pivalate, benzyl bromide and, alkyl group having 1 to 4 carbon atoms, —ORa, —COORa, —CORa (where Ra represents an alkyl group having 1 to 4 carbon atoms, or a phenyl group) or halogen group-substituted bodies of the compounds, by adding, if necessary, a de-halogenic acid agent such as triethylamine and the like, then, it is reacted with a tetracarboxylic acid dianhydride. Further, after synthesis of a polyamic acid, a protection reaction-for an end amino group may be conducted. The preferable ratio (mole ratio) of the diamine to protecting agent (former/latter) is between 1/0.05 and 1/2. The preferable ratio of the protecting agent to de-halogenic acid agent (former/latter) is between 1/0.95 and 0.95/1. The reaction temperature is preferably between 0° C. and 80° C., and the reaction time is preferably between 1 minute and 24 hours.

The reaction of a tetracarboxylic acid diester dihalide and a diamine is conducted, for example, by dissolving the diamine having an acid group and the de-halogenic acid agent such as pyridine and the like in an organic solvent, and dropping the tetracarboxylic acid diester dihalide dissolved in an organic solvent. Then, the reaction mixture is added into a poor solvent such as water and the like, and the resultant precipitate is filtered off and dried to obtain a polyamic acid ester. When a part of amino groups of a diamine is protected, the preferable ratio of the total amount of the diamine to the total amount of the tetracarboxylic acid diester dihalide (former/latter) is between 0.8/1 and 1/0.8, and when a part of amino groups of a diamine is not protected, the preferable ration is between 0.5/1 and 0.99/1. The reaction temperature is preferably between −20 and 40° C., and the reaction time is preferably between 1 and 10 hours. The preferable ratio of the de-halogenic acid agent to the total amount of the dicarboxylic chloride and tetracarboxylic acid diester (former/latter) is between 1.9/1 and 2.1/1.

When the component (a) is synthesized using excess moles of the acid component than the diamine component and the end of the component (a) is composed of an imide-ring-closable protecting group, a monoamine can be used in addition to the diamine. As the monoamine, aniline, toluidine, propylamine, isopropylamine, butylamine and the like are preferable, and these can be used singly or in combination of two or more. The preferable ratio of the total amount of the diamine and monoamine to the total amount of the tetracarboxylic acid dianhydride (former/latter) is between 0.8/1 and 1/0.8.

The acid group may be protected using protecting agents such as 2,3-dihydrofuran, 2,5-dihydrofuran, 2,3-dihydrobenzofuran, 2-chlorotetrahydrofuran, 2,3-dihydro-4H-pyrane, 2,3-dihydro-6H-pyrane, 3,4-dihydro-α-pyrane, 2,3-dihydroy-pyrane, coumarin, chloromethyl methyl ether, chloromethyl ethyl ether, chloromethyl propyl ether, vinyl methyl ether, vinyl ethyl ether, di-t-butyl dicarbonate, isobutene and, alkyl group having 1 to 4 carbon atoms, —CHO, —CH$_2$OH, —OH, —ORb, —COORb, —CORb (where Rb represents an alkyl group having 1 to 4 carbon atoms, or a phenyl group) or halogen group-substituted bodies of the compounds.

In the reaction of the polyamic acid and the protecting agent for acid group, it is preferable, for example, that the polyamic acid is dissolved in an organic solvent, the protecting agent for acid group is dropped, further, if necessary, an acid catalyst such as hydrochloric acid and the like or a de-halogenic acid agent such as triethylamine and the like are added. Thereafter, the reaction mixture is added into a poor solvent such as water and the like, and the resultant precipitate is filtered off and dried to obtain an intended polyimide precursor. The preferable ratio of an acid group of the polyamic acid to the protecting agent for acid group (former/latter) is between 1/0.2 and 1/20. The preferable ratio of the protecting agent for acid group to an acid catalyst or de-helogenic acid (former/latter) is between 1/0.001 and 1/1.2. The reaction temperature is preferably between 0 and 80° C., and the reaction time is preferably between 10 minutes and 48 hours.

The component (a) can be obtained by, for example, reacting the tetracarboxylic acid dianhydride with the diamine, to synthesize a polyamic acid, and reacting the protecting agent for acid group. In this procedure, it is preferable to protect a part of amino groups of a diamine in the same manner as described above, or make the mole number of moles of a tetracarboxylic acid dianhydride used greater than that of a diamine. The reaction is preferably conducted in an organic solvent.

For synthesis of a polyamic acid, it is preferable, for example, that a diamine is dissolved in an organic solvent, and a tetracarboxylic acid dianhydride is added to this. When a part of amino groups of a diamine is protected, the preferable ratio of the total amount of the diamine to the total amount of the tetracarboxylic acid dianhydride (former/latter) is between 0.8/1 and 1/0.8, and when a part of amino groups of a diamine is not protected, the preferable ratio is between 0.5/1 and 0.99/1. The reaction temperature is preferably between 10 and 100° C., and the reaction time is preferably between 20 minutes and 48 hours.

Further, the component (a) can be obtained by, for example, reacting the tetracarboxylic acid dianhydride with the diamine, to synthesize a polyamic acid, conducting imidation by heating, then reacting the protecting agent for acid group. In this case, it is preferable to protect an amino group present after imidation, or make the mole number of moles of a tetracarboxylic acid dianhydride used larger than that of a diamine. The reaction is preferably conducted in an organic solvent. When a part of amino groups of a diamine is protected, the preferable ratio of the total amount of the diamine to the total amount of the tetracarboxylic acid dianhydride (former/latter) is between 0.8/1 and 1/0.8, and when a part of an amino group of a diamine is not protected, the preferable ratio is between 0.5/1 and 0.99/1.

Imidation of the polyamic acid preferably performed as follows. That is, a polyamic acid synthesized in an organic solvent is heated in the presence of xylene and the like, and water produced by an imidation reaction is removed together with xylene by azeotropic distillation. The reaction temperature is preferably between 100 and 300° C., and the reaction time is preferably between 20 minutes and 48 hours. Protection of an acid group is preferably conducted by the same manner as described above.

In synthesis of the component (a), a dicarboxylic acid or a derivative thereof or a tricarboxylic acid or a derivative thereof may be used in part of this, preferably, in less than 50 mole % of all acid components.

As the dicarboxylic acid compound, aromatic dicarboxylic acids are preferable. Examples of such acids are terephthalic acid, isophthalic acid, o-phthalic acid, 4,4'-diphenyidicarboxylic acid, 2,2'-diphenyidicarboxylic acid, benzophenone-4,4'-diphenyldicarboxylic acid, benzophenone-2,2'-diphenyldicarboxylic acid, 4,4'-dicarboxydiphenyl ether, 2,2'-dicarboxy diphenyl ether, 4,4'-dicarboxy diphenyl sulfone, 2,2'-dicarboxy diphenyl sulfone, 4,4'-dicarboxy diphenyl sulfide, 2,2'-dicarboxy diphenyl sulfide, 4,4'-dicarboxy diphenyl methane, 2,2'-dicarboxy diphenyl methane, 4,4'-dicarboxy diphenyl propane, 2,2'-dicarboxy diphenyl propane, 4,4'-dicarboxy diphenyl hexafluoropropane, 2,2'-dicarboxy diphenyl hexafluoropropane, and the like, and dicarboxylic chlorides synthesized from them can be used singly or in combination of two or more.

The dicarboxylic acid diester dichloride may be synthesized using known methods. That is, the dicarboxylic acid diester dichloride may be synthesized by, for example, dropping thionyl chloride into and reacting thionyl chloride with a dicarboxylic acid dissolved in an organic solvent. The preferable ratio of the dicarboxylic acid to thionyl chloride (former/latter) is between 1/1.1/and 1/2.5, and more preferably between 1/1.4 and 1/2.2. The reaction temperature is preferably between −20° C. and 40° C., and the reaction time is preferably between 1 and 10 hours. Some of the dicarboxylic acid diester dichlorides are commercially available.

As the tricarboxylic acid compound, trimellitic chloride is preferable.

In addition to the above-described method, there are known methods of synthesizing the component (a), and these methods may be used to synthesize the component (a).

The component (b) used in the present invention generates an acid when it is exposed to light. Moreover, the component (b) is capable of detaching the protecting group from the protected acid group. The acid generated returns the protected acid group of the component (a) to an acid group by a de-protecting reaction. As a result, solubility of the area that is exposed to the light increases for alkali aqueous solutions. The compound (b) may be aryl diazonium splt, diaryl iodonium salt, triaryl sulfonium salt, imide sulfonate compound, nitrobenzyl compound, s-triazine compound, o-naphthoquinone diazide-4-sulfonium compound and the like. The compound (b) may specifically be, benzendiazonium-p-toluene sulfonate, diphenyl iodonium 9,10-dimethoxyanthracene-2-sulfonate, tris(4-tert-butylphenyl)sulfonium trifluoromethane sulfonate, N-hydroxynaphtalimide trifluoromethane sulfonate, p-nitrobenzyl-9,10-dimethoxyanthracene-2-sulfonate, 4-methoxy-α-[[[(4-methylphenyl)sulfonyl]oxy]imino]benzene acetonitrile, 2-(2'-furylethenyl)-4,6-bis(trichloromethyl)-1,3,5-triazine, o-naphthoquinone diazide-4-sulfonate, and the like. Some of these compounds are commercially available.

The o-naphtoquinone diazide-4-sulfonate is obtained by reacting o-naphthoquinone diazide-4-sulfonic chloride with a hydroxy compound in an organic solvent in the presence of de-hydrogen chloride agent.

Following compounds may be used as the hydroxy compound. That is, hydroquinone, resorcinol, pyrogallol, bisphenol A, bis(4-hydroxyphenyl)methane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethylindeno[2,1-a]indene, tris(4-hydroxyphenyl)methane, tris(4-hydroxyphenyl)ethane.

The preferable ratio of the o-quinone diazide-4-sulfonic chloride to hydroxy compound (former/latter) is between 0.5/1 and 1/1. The preferable ratio of the de-hydrogen chloride agent to o-quinone diazide-4-sulfonic chloride (former/latter) is between 0.95/1 and 1/0.95. The reaction temperature is preferably between 0 and 40° C., and the reaction time is preferably between 1 and 10 hours.

Solvents such as dioxane, acetone, methyl ethyl ketone, tetrahydrofuran, diethyl ether, N-methylpyrrolidone may be used as the reaction solvent. As the de-hydrochloric acid agent, sodium carbonate, sodium hydroxide, sodium hydrogen carbonate, potassium carbonate, potassium hydroxide, trimethylamine, triethylamine, pyridine and the like can be listed.

In the photosensitive polymer composition of the present invention, the combining amount of the component (b) is preferably between 0.05 and 100 parts by weight, more preferably between 0.1 and 40 parts by weight based on 100 parts by weight of the component (a) from the standpoints of difference in dissolution rate between exposed area and non-exposed area and permissible width of sensitivity.

The photosensitive polymer composition of the present invention can be obtained by dissolving the component (a), component (b) and other components in a solvent. As the solvent, preferable are aprotic polar solvents such as, for example, N-methyl-2-pyrrolidone, N,N-dimethylformamide, N,N-dimethylacetamide, dimethyl sulfoxide, hexamethylphosphoramide, tetramethylene sulfone, γ-butyrolactone and the like, and they are used singly or in combination of two or more. For improvement of an applying ability, solvents such as diethylketone, diisobutylketone, methylamylketone, ethyl lactate, propylene glycol monomethyl ether acetate and the like can be used together.

In the heat resistant photosensitive polymer composition of the present invention, a compound having a phenolic hydroxyl group may be used, if necessary, for improvement of sensitivity and shortening of development time. Following compounds are the specific examples of the compound having a phenolic hydroxyl group, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, bis(3-amino-4-hydroxyphenyl)ether, bis(4-amino-3-hydroxyphenyl)ether, bis(3-amino-4-hydroxyphenyl)hexafluoropropane, bis(4-amino-3-hydroxyphenyl)hexafluoropropane, biphenol, bisphenol A, bisphenol F, bis(2-hydroxy-5-methylphenyl)methane, 4,4'-dihydroxybenzophenone, tris(4-hydroxyphenyl)methane, 2,4',4''-methylidenetrisphenol, tris(4-hydroxyphenyl)ethane, tris(4-hydroxy-2-methylphenyl)ethane, 2,6-bis[(2-hydroxy-5-methylphenyl)methyl]-4-methylphenol, 4,4',4'',4'''-(1,2-ethanedylidene)tetrakisphenol, 2,2'-methylenebis[6-[(2-hydroxy-5-methylphenyl)methyl]-4-methylphenol], 3,3'-methylenebis(2-hydroxy-5-methylbenzenemethanol), 4,4'-(1-methylethylidene)bis[2-methyl-6-6hydroxymethylphenol], 3,3',5,5'-tetrakis(hydroxymethyl)[(1,1'-biphenyl)-4,4'-diol], 4,4'-(1-methylethylidene)bis[2,6-bis(hydroxymethyl)phenol], 2,2'-methylenebis(4,6-bishydroxymethylphenol), 2,6-bis[(2-hydroxy-3-hydroxymethyl-5-methylphenyl)methyl]-4-methylphenol.

In the photosensitive polymer composition of the present invention, the combining amount of the compound having a phenolic hydroxyl group is preferably between 1 and 30 parts by weight, more preferably between 5 and 20 parts by weight based on 100 parts by weight of the component (a) from the standpoints of developing time and permissible width of the film retention ratio at non-exposed area.

In the present invention, a compound having an effect of disturbing dissolution of the component (a) into an alkali aqueous solution can be used together with the compound having a phenolic hydroxyl group. By use of the compound having an effect of disturbing dissolution of the component (a), the dissolution rate of non-exposed area in developing with an alkali aqueous solution decreases, and in conjugation with the effect of the compound having a phenolic hydroxyl group, a difference in solubility between exposed area and non-exposed area increases, thus, excellent patterns can be formed. Specifically, diphenyl iodonium nitrate, diphenyl iodonium trifluoromethane sulfonate, diphenyl iodonium bromide, diphenyl iodonium chloride, diphenyl iodonium iodide and the like can be used. These compounds can be obtained as commercially available products.

In the photosensitive polymer composition of the present invention, the combining amount of the compound having an effect of disturbing dissolution of the component (a) into an alkali aqueous solution is preferably between 0.01 and 15 parts by weight, more preferably between 0.05 and 10 parts by weight based on 100 parts by weight of the component (a) from the standpoints of sensitivity and permissible width of the development time.

The heat resistant photosensitive polymer composition of the present invention can further contain an organic silane compound or aluminum chelate compound as an adhesion promoter, if necessary.

As the organic silane compound, for example, γ-aminopropyltrimethoxysilane, γ-aminopropyltriethoxysilane, vinyltriethoxysilane, γ-glycidoxypropyltriethoxysilane, γ-methacryloxypropyltrimethoxysilane, urea propyltriethoxysilane and the like can be listed. As the aluminum chelate compound, for example, tris(acetyl acetonate)aluminum, acetyl acetate aluminum diisopropylate and the like can be listed.

When an adhesion promoter is used, the used amount of the adhesion promoter is preferably between 0.1 and 20 parts by weight, more preferably between 0.5 and 10 parts by weight based on 100 parts by weight of the component (a).

The photosensitive polymer composition of the present invention can be made into a relief pattern of a polyimide via a process of application onto a supporting substrate and drying it, a process of exposure, a process of development, and a process of heat-treatment. In the process of application onto a supporting substrate and drying it, this photosensitive polymer composition is rotation-applied onto a supporting substrate such as a glass substrate, semiconductor, metal oxide insulator (for example, $TiO_2$, $SiO_2$ and the like), silicon nitride and the like using a spinner and the like, then, dried using a hot plate, oven or the like.

Next, the photosensitive polymer composition with a coat on the supporting substrate is exposed to, via a mask, active rays such as ultraviolet rays, visible rays, radiation and the like. Since a pattern having high resolution can be formed, it is preferred that the photosensitive polymer composition is exposed to i-line (single color light of 365 nm).

In the development process, a relief pattern is obtained by removing exposed area with a developer. As the developer, for example, alkali aqueous solutions such as sodium hydroxide, potassium hydroxide, sodium silicate, ammonia, ethylamine, diethylamine, triethylamine, triethanolamine, tetramethyl ammonium hydroxide and the like can be listed. The base concentration of these aqueous solutions is preferably between 0.1 and 10% by weight.

Further, alcohols and surfactants can be added into the developer. The alcohols and surfactants can be combined each in an amount of preferably between 0.01 and 10 parts by weight, more preferably between 0.1 and 5 parts by weight based on 100 parts by weight of the developer. Next, in the heat-treatment process, the resulted relief pattern is preferably subjected to heat-treatment at a temperature between 150 and 450° C., to give a relief pattern of a heat resistant polyimide having an imide ring and other cyclic groups.

The photosensitive polymer composition of the present invention can be used in semiconductor devices, multi-layered interconnection boards and the like employed in the electronic equipment. The photosensitive polymer composition of the present invention can be specifically used for formation of a passivation film and an interlayer insulating film of the semiconductor device, and an interlayer insulating film of the multi-layered interconnection board. The semiconductor device of the present invention is not particularly restricted as far as it has a passivation film and an interlayer insulating film formed using the composition according to the present invention, and various structures can be formed as the device.

The semiconductor device of the present invention is manufactured, for example, as shown in FIGS. 1A to 1E. The semiconductor device has a multi-layered interconnection structure. A semiconductor substrate 1 such as a Si substrate and the like having a circuit element is coated with a protecting film 2 such as a silicon oxide film and the like excluding given parts of the circuit element, and a first conductor layer is formed on the exposed circuit element. A film 4 of a polyimide resin or the like is formed as an interlayer insulating film by a spin coat method and the like on the semiconductor substrate (see FIG. 1A).

Figure 1B:
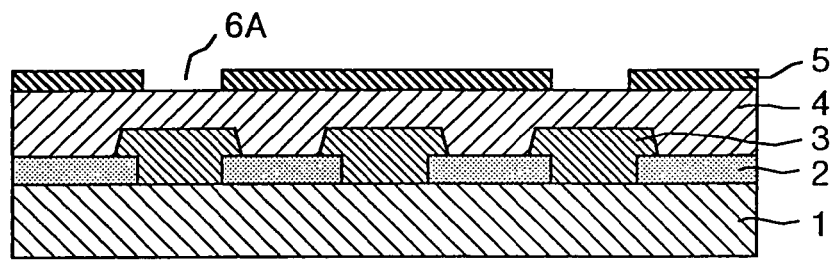
Figure 1C:
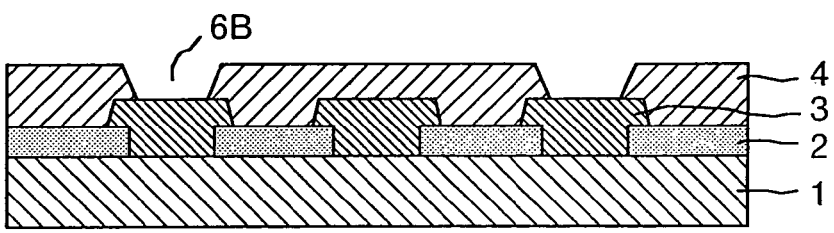

Next, a photosensitive resin layer 5 of chlorinated rubber or phenol novolak-base is formed by a spin coat method on the interlayer insulating film 4, and a window 6A is provided so that the interlayer insulating film 4 at given parts is exposed by a known photography etching technology (see FIG. 1BS). The interlayer insulating film 4 of the window 6A is selectively etched by dry etching means using gas such as oxygen, carbon tetrafluoride and the like, to provide a window 6B. Then, a photosensitive resin layer 5 is completely removed using an etching solution which corrodes only the photosensitive resin layer 5 without corroding a first conductor layer 3 exposed from the window 6B (see FIG. 1C).

Figure 1D:
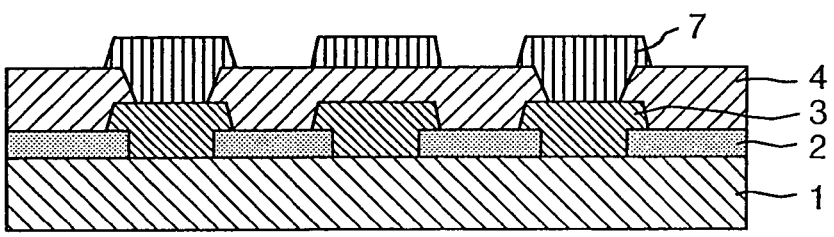

Further, using a known photography etching technology, a second conductor layer 7 is formed, and electric-connection with the first conductor layer 3 is completely accomplished (see FIG. 1D). When a multi-layered interconnection structure of three or more layers is formed, each layer can be formed by repeating the above-mentioned processes.

Figure 1E:
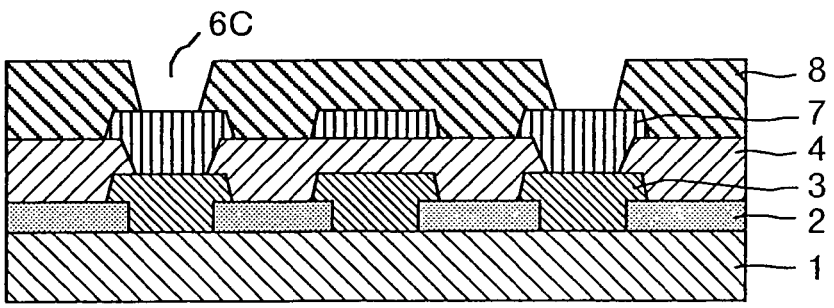

Next, a passivation film 8 is formed (see FIG. 1E). In the example of this drawing, for providing this passivation film 8, the photosensitive polymer composition is applied by a spin coat method and dried, and irradiated with light through a mask carrying a pattern forming a window 6C at given part, then, developed with an alkali aqueous solution to form a pattern, and heated to form a polyimide film. This polyimide film is used for protection of a conductor layer from stress from exterior, α ray and the like, and the resulting semiconductor device is excellent in reliability. In the example, it is also possible to form an interlayer insulating film using the photosensitive polymer composition of the present invention.

EXAMPLES

The present invention will be now explained using concrete examples. In these examples, an organic solvent which had been dehydrated was used, and a polymer synthesis operation was conducted under a nitrogen atmosphere.

Example 1

Into a 1 liter flask equipped with a stirrer and a thermometer were charged 83.76 g (0.270 mole) of 3,3',4,4'-diphenyl ether tetracarboxylic acid dianhydride, 32.45 g (0.540 mole) of isopropyl alcohol, 0.82 g (0.0081 mole) of triethylamine and 348.63 g of N-methylpyrrolidone (NMP). This mixture was then stirred at room temperature for 120 hours to cause a reaction thereof, to synthesize 3,3',4,4'-diphenyl ether tetracarboxylatic acid diisopropyl ester. The flask was then cooled to 0° C., and 64.24 g (0.540 mole) of thionyl chloride was added drop-by-drop and the contents were made to reacted for 30 minutes to obtain an NMP solution (α) of 3,3',4,4'-diphenyl ether tetracarboxylatic acid diisopropyl ester dichloride.

Into a 1 liter flask equipped with a stirrer, a thermometer, and a Dimroth condenser tube was charged 367.08 g of NMP. 80.58 g (0.220 mole) of bis(3-amino-4-hydroxyphenyl) hexafluoropropane and the mixture was stirred for dissolution thereof, then, 8.28 g (0.0484 mole) of benzyl bromide and 4.90 g (0.0484 mole) of triethylamine were added in the flask. The flask was heated to 80° C. and the contents were made to reacted for 30 hours, to obtain an NMP solution (β) of bis(3-amino-4-hydroxyphenyl)hexafluoropropane in which a part of amino groups had been protected.

Into a 0.5 liter flask equipped with a stirrer and a thermometer was added 209.5 g (equivalent to 0.100 mole) of the NMP solution (β) of bis(3-amino-4-hydroxyphenyl)hexafluoropropane in which a part of amino groups had been protected and 28.48 g (0.360 mole) of pyridine, and while maintaining the temperature at 0 to 5° C., 176.64 g (equivalent to 0.090 mole) of the NMP solution (α) of diisopropyl 3,3',4,4'-diphenyl ether tetracarboxylate dichloride was added drop-by-drop over 40 minutes, then, stirring thereof was continued for 1 hour. The solution was added into 4 liter of water, and the precipitate was recovered and washed, then, dried under reduced pressure to obtain 69 g of a polyimide precursor (P-1).

50.00 g of the resulted polyimide precursor (P-1) (about 0.135 mole of phenolic hydroxyl group) was charged into a 0.5 liter flask equipped with a stirrer and a thermometer. 200.00 g of NMP was added into the flask and the mixture was dissolved. Further, 147.93 g (1.759 mole) of 3,4-dihydro-2-pyrane and 2.57 g (0.014 mole) of p-toluenesulfonic acid (monohydrate) were added into the flask, and the solution was made to react for 2 hours while the flask is at room temperature. The solution was then added into 4 liter of water, and the precipitate was recovered and washed, then, dried under reduced pressure to obtain a polyimide precursor (P-2). The weight-average molecular weight measured using GPC (column: GL-S300 MDT-5 manufactured by Hitachi Chemical Co., Ltd.) was 23,300. The ratio of protected acid groups, measured by H-NMR (AMX400 manufactured by BRUKER) was 65%, thus it was confirmed that there was substantially no amino group at the end of the polymer.

10.00 g of the polyimide precursor (P-2), 0.50 g of diphenyl iodonium 9,10-dimethoxyanthracene-2-sulfonate and 0.80 g of a 50% methanol solution of urea propyltriethoxysilane were dissolved while stirring in 16.32 g of γ-butyrolactone. This solution was filtrated under pressure using a Teflon (Registered Trademark) filter having pores of 3 μm to obtain a photosensitive polymer composition.

The resulted photosensitive polymer composition was rotation-applied on a silicon wafer using a coater track (Mark VII manufactured by TEL), and dried by heating at 100° C. for 2 minutes on a hot plate, to obtain a coated film of 12.3 μm. This coated film was irradiated with light using an i-line stepper (FPA 3000 iW manufactured by Cannon Inc.) as an exposure equipment, via a reticule, while gradually changing the exposure dose between 100 mJ/cm$^2$ and 1500 mJ/cm$^2$. Next, heat-treatment was conducted at 120° C. for 3 minutes on a hot plate, then, paddle development was conducted for 280 seconds using a 2.38% by weight aqueous solution of tetramethyl ammonium hydroxide as a developer, and the film was washed with deionized water to obtain a relief pattern. This was observed by a metal microscope, and the exposure dose at which a 100 μm square pattern was opened was considered as the sensitivity. It was confirmed that the film thickness of non-exposed area after development was 9.8 μm, and the film retention ratio was 80%, and the sensitivity was 260 mJ/cm$^2$. The resulted relief pattern was heat-treated under a nitrogen atmosphere at 350° C. for 1 hour, to obtain a pattern of a polyimide film.

Example 2

Into a 0.3 liter flask equipped with a stirrer and a thermometer were charged 12.91 g (0.050 mole) of 4,4'-dicarboxy diphenyl ether and 73.17 g of NMP. The mixture was then dissolved by stirring at room temperature. The flask was then cooled to 0° C., 11.90 g (0.100 mole) of thionyl chloride was added drop-by-drop and reacted for 30-minutes, to obtain an NMP solution (γ) of 4,4'-dicarboxy diphenyl ether dichloride.

Next, into a 0.5 liter flask equipped with a stirrer and a thermometer was added 209.5 g (equivalent to 0.100 mole) of the NMP solution (β) of bis(3-amino-4-hydroxyphenyl) hexafluoropropane in which a part of amino groups obtained in Example 1 had been protected and 28.48 g (0.360 mole) of pyridine, and while maintaining the temperature at 0 to 5° C., a mixed solution of 117.76 g (equivalent to 0.060 mole) of the NMP solution (α) of diisopropyl 3,3',4,4'-diphenyl ether tetracarboxylate dichloride obtained in Example 1 and 58.78 g (equivalent to 0.030 mole) of the NMP solution (γ) of 4,4'-dicarboxy diphenyl ether dichloride was added drop-by-drop over 40 minutes, then, stirring thereof was continued for 1 hour. The solution was added into 4 liter of water, and the precipitate was recovered and washed, then, dried under reduced pressure to obtain 62 g of a polyimide precursor (P-3).

50.00 g of the resulted polyimide precursor (P-3) (about 0.150 mole of phenolic hydroxyl group) was charged into a 0.5 liter flask equipped with a stirrer and a thermometer, and to this was added 200.00 g of NMP and dissolved, and 164.19 g (1.952 mole) of 3,4-dihydro-2-pyrane and 2.86 g (0.015 mole) of p-toluenesulfonic acid (monohydrate) were added, and the solution was made to react at room temperature for 2 hours. The solution was added into 4 liter of water, and the precipitate was recovered and washed, then, dried under reduced pressure to obtain a polyimide precursor (P-4). The weight-average molecular weight was 24,800, and the ratio of protected acid groups was 69%, and there was substantially no amino group at the end of the polymer.

10.00 g of the polyimide precursor (P-4), 0.50 g of diphenyl iodonium 9,10-dimethoxyanthracene-2-sulfonate and 0.80 g of a 50% methanol solution of urea propyltriethoxysilane were dissolved while stirring in 16.32 g of γ-butyrolactone. This solution was filtrated under pressure using a Teflon (Registered Trade Mark) filter having pores of 3 μm to obtain a photosensitive polymer composition.

The resulted photosensitive polymer composition was evaluated in the same manner as in Example 1 except that the development time was changed to 260 seconds. It was confirmed that the film retention ratio was 83%, and sensitivity was 280 mJ/cm$^2$. The resulted relief pattern was heat-treated under a nitrogen atmosphere at 350° C. for 1 hour, to obtain a pattern of a polyimide film.

Example 3

Into a 0.5 liter flask equipped with a stirrer, a thermometer, and a Dimroth condenser tube was charged 207.08 g of NMP, and to this was added 22.35 g (0.090 mole) of 4,4'-diaminodiphenyl sulfone, and the mixture was stirred for dissolution thereof, then, 29.42 g (0.100 mole) of 3,3',4,4'-biphenyltetracarboxylic acid dianhydride was added and reacted at 70° C. for 1 hour, to obtain an NMP solution of a polyamic acid. The solution was left at room temperature for 20 hours, then, the flask was cooled to 0° C., and 13.24 g (0.140 mole) of chloromethyl ethyl ether was added drop-by-drop, followed by 14.17 g (0.140 mole) of triethylamine, and the solution was made to react for 1 hour. The solution was added into 3 liter of water, and the precipitate was recovered and washed, then, dried under reduced pressure to obtain a polyimide precursor (P-7). The weight-average molecular weight was 22,500, and the ratio of protected acid groups was 55%. Thus, it was confirmed that there was substantially no amino group at the end of the polymer. From measurement of H-NMR, it was confirmed that about 10% of repeating structures of the polyimide precursor (P-7) were imides of the general formula (II).

10.00 g of the polyimide precursor (P-7), 0.30 g of N-hydroxynaphthalimide trifluoromethane sulfonate, and 0.80 g of a 50% methanol solution of urea propyltriethoxysilane were dissolved while stirring in 16.32 g of γ-butyrolactone. This solution was filtrated under pressure using a Teflon (Registered Trade Mark) filter having pores of 3 μm to obtain a photosensitive polymer composition.

The resulted photosensitive polymer composition was evaluated in the same manner as in Example 1 except that the development time was changed to 80 seconds. It was confirmed that the film retention ratio was 87%, and the sensitivity was 180 mJ/cm$^2$. The resulted relief pattern was heat-treated under a nitrogen atmosphere at 350° C. for 1 hour, to obtain a pattern of a polyimide film.

Example 4

Into a 0.5 liter flask equipped with a stirrer, a thermometer, and a Dimroth condenser tube was charged 218.19 g of NMP, and to this was added 24.83 g (0.100 mole) of 4,4'-diaminodiphenyl sulfone, and the mixture was stirred for dissolution thereof. The flask was then cooled to 0° C., and 1.02 g (0.013 mole) of acetyl chloride was added drop-by-drop, followed by 1.32 g (0.013 mole) of triethylamine, and the solution was made to react for 1 hour. Then, 29.72 g (0.101 mole) of 3,3',4,4'-biphenyltetracarboxylic acid dianhydride was added and reacted at 70° C. for 1 hour, to obtain an NMP solution of a polyamic acid. The solution was left at room temperature for 20 hours, then, the flask was cooled to 0° C., and 13.24 g (0.140 mole) of chloromethyl ethyl ether was added drop-by-drop, then, 14.17 g (0.140 mole) of triethylamine was added drop-by-drop, and the solution was made to react for 1 hour. The solution was added into 3 liter of water, and the precipitate was recovered and washed, then, dried under reduced pressure to obtain a polyimide precursor (P-8). The weight-average molecular weight was 20,700, and the ratio of protected acid groups was 51%. Thus, it was confirmed that there was substantially no amino group at the end of the polymer. From measurement of H-NMR, it was confirmed that about 12% of repeating structures of the polyimide precursor (P-8) were imides of the general formula (II).

10.00 g of the polyimide precursor (P-8), 0.50 g of 4-methoxy-α-[[[(4-methylphenyl)sulfonyl]oxy]imino]benzene acetonitrile, and 0.80 g of a 50% methanol solution of urea propyltriethoxysilane were dissolved while stirring in 16.32 g of γ-butyrolactone. This solution was filtrated under pressure using a Teflon (Registered Trade Mark) filter having pores of 3 μm to obtain a photosensitive polymer composition.

Example 5

Into a 1 liter flask equipped with a stirrer, a thermometer, and a Dimroth condenser tube was charged 202.94 g of N-methyl-2-pyrrolidone and 50.74 g of xylene, and to this was added 36.63 g (0.100 mole) of bis(3-amino-4-hydroxyphenyl)hexafluoropropane, and the mixture was dissolved by stirring, then, 31.02 g (0.100 mole) of 3,3',4,4'-biphenyl ether tetracarboxylic acid dianhydride and 0.54 g (0.030 mole) of water were added, and the mixture was stirred for 2 hours. The flask was then heated to 70° C., and stirring thereof was continued for 6 hours, to obtain a polyamic acid solution.

Next, the flask was installed to a water content measuring apparatus, and heated at 160° C. for 2 hours, and water produced by an imidation reaction was removed by azeotropic distillation with xylene, to obtain a polyimide solution. To this was added 327.37 g (1.500 mole) of di-tert-butyl dicarbonate, and the mixture was stirred at 60° C. for 24 hours, then, the solution was added into 6 liter of water, and the precipitate was recovered and washed, then, dried under reduced pressure to obtain an intended polyimide precursor (P-11). The weight-average molecular weight was 25,300, and the ratio of protected acid groups was 46%, and there was substantially no amino group at the end of the polymer.

10.00 g of the polyimide precursor (P-11), 0.50 g of p-nitrobenzyl-9,10-dimethoxyanthracene-2-sulfonate, and 0.80 g of a 50% methanol solution of urea propyltriethoxysilane were dissolved while stirring in a mixed solution of 11.42 g of γ-butyrolactone and 4.90 g of N-methylpyrrolidone. This solution was filtrated under pressure using a Teflon (Registered Trade Mark) filter having pores of 3 μm to obtain a photosensitive polymer composition.

The resulted photosensitive polymer composition was evaluated in the same manner as in Example 1. It was confirmed that the film retention ratio was 92%, and the sensitivity was 320 mJ/cm$^2$. The resulted relief pattern was heat-treated under a nitrogen atmosphere at 350° C. for 1 hour, to obtain a pattern of a polyimide film.

Example 6

Into a 1 liter flask equipped with a stirrer, a thermometer, and a Dimroth condenser tube was charged 200.14 g of N-methyl-2-pyrrolidone and 50.04 g of xylene, and to this was added 36.63 g (0.100 mole) of bis(3-amino-4-hydroxyphenyl)hexafluoropropane, and the mixture was dissolved by stirring, then, 2.11 g (0.010 mole) of trimellitic chloride was added, and 0.79 g (0.010 mole) of pyridine was added drop-by-drop. Subsequently, 28.54 g (0.092 mole) of 3,3',4,4'-biphenyl ether tetracarboxylic acid dianhydride and 0.54 g (0.030 mole) of water were added, and the mixture was stirred for 2 hours. The flask was then heated to 70° C., and stirring thereof was continued for 6 hours. The solution was returned to room temperature, and 3.13 g (0.020 mole) of phenyl chloroformate and 2.02 g (0.020 mole) of triethylamine were added drop-by-drop, and the mixture was stirred for 2 hours. The solution was added into 3 liter of water, and the precipitate was recovered and washed, then, dried under reduced pressure, to obtain a polyimide precursor (P-12).

Next, the flask was installed to a water content measuring apparatus, and heated at 160° C. for 2 hours, and water produced by an imidation reaction was removed by azeotropic distillation with xylene, to obtain a polyimide solution. The solution was returned to room temperature, and 3.13 g (0.020 mole) of phenyl chloroformate and 2.02 g (0.020 mole) of triethylamine were dropped respectively, and the mixture was stirred for 2 hours. The solution was added into 3 liter of water, and the precipitate was recovered and washed, then, dried under reduced pressure, to obtain 64 g of a polyimide (P-12).

50.00 g of the resulted polyimide precursor (P-12) (about 0.156 mole of phenolic hydroxyl group) was charged into a 0.5 liter flask equipped with a stirrer and a thermometer, and to this was added 200.00 g of NMP and dissolved, and 147.93 g (1.759 mole) of vinyl ethyl ether and 2.57 g (0.014 mole) of p-toluenesulfonic acid (monohydrate) were added, and the solution was made to react at room temperature for 5 hours. The solution was added into 4 liter of water, and the precipitate was recovered and washed, then, dried under reduced pressure to obtain a polyimide precursor (P-13). The weight-average molecular weight was 22,800, and the ratio of protected acid groups was 57%, and there was substantially no amino group at the end of the polymer.

10.00 g of the polyimide precursor (P-13), 0.50 g of p-nitrobenzyl-9,10-dimethoxyanthracene-2-sulfonate, 0.50 g of bisphenol A and 0.80 g of a 50% methanol solution of urea propyltriethoxysilane were dissolved while stirring in a mixed solution of 11.42 g of γ-butyrolactone and 4.90 g of N-methylpyrrolidone. This solution was filtrated under pressure using a Teflon (Registered Trade Mark) filter having 3 µm of pores to obtain a photosensitive polymer composition.

The resulted photosensitive polymer composition was evaluated in the same manner as in Example 1 except that the development time was changed to 300 seconds. It was confirmed that the film retention ratio was 92%, and the sensitivity was 340 mJ/cm$^2$. The resulted relief pattern was heat-treated under a nitrogen atmosphere at 350° C. for 1 hour, to obtain a pattern of a polyimide film.

Example 7

Into a 0.3 liter flask equipped with a stirrer, a thermometer, and a Dimroth condenser tube was charged 100.66 g of NMP, and to this was added 10.01 g (0.100 mole) of 4,4'-diaminodiphenyl ether, and the mixture was stirred for dissolution thereof, then, 0.86 g (0.015 mole) of p-toluenesulfonic chloride was added drop-by-drop, then, 0.76 g (0.015 mole) of triethylamine was added drop-by-drop, and the solution was made to react for 1 hour. Then, 15.15 g (0.103 mole) of 3,3',4,4'-biphenyltetracarboxylic acid dianhydride was added and reacted at 70° C. for 1 hour. The solution was left at room temperature for 20 hours, then, the produced triethylamine hydrochloride was filtrated off, to obtain an NMP solution of a polyamic acid.

Next, this NMP solution of a polyamic acid was transferred into a 0.3 liter autoclave, and 56.11 g (1.000 mole) of isobutene and 4.01 g (0.021 mole) of p-toluenesulfonic acid (monohydrate) were added, and the solution was made to react at room temperature for 36 hours. The solution was added into 2 liter of water, and the precipitate was recovered and washed, then, dried under reduced pressure to obtain a polyimide precursor (P-14). The weight-average molecular weight was 19,100, and the ratio of protected acid groups was 47%, and there was substantially no amino group at the end of the polymer.

10.00 g of the polyimide precursor (P-14), 0.90 g of an orthoquinone diazide compound obtained by reacting 2,3,4-trihydroxybenzophenone and naphthoquinone-1,2-diazide-4-sulfonyl chloride at a mole ratio of 1/2.5 and 0.80 g of a 50% methanol solution of urea propyltriethoxysilane were dissolved while stirring in 16.32 g of γ-butyrolactone. This solution was filtrated under pressure using a Teflon (Registered Trade Mark) filter having pores of 3 µm to obtain a photosensitive polymer composition.

The resulted photosensitive polymer composition was evaluated in the same manner as in Example 1 except that the development time was changed to 60 seconds. It was confirmed that the film retention ratio was 85%, and the sensitivity was 240 mJ/cm$^2$. The resulted relief pattern was heat-treated under a nitrogen atmosphere at 350° C. for 1 hour, to obtain a pattern of a polyimide film.

Example 8

Into a 0.5 liter flask equipped with a stirrer, a thermometer, and a Dimroth condenser tube was charged 142.74 g of NMP, and to this was added 30.03 g (0.100 mole) of 3,3',4,4'-bicyclohexyltetracarboxylic acid dianhydride, and dispersed, then, the mixture was heated to 70° C., and a solution prepared by dissolving 16.02 g (0.080 mole) of 4,4'-diaminodiphenyl ether into 57.56 g of NMP was added drop-by-drop over 1 hour, to obtain an NMP solution of a polyamic acid.

The solution was left at room temperature for 20 hours, then, 12.29 g (0.130 mole) of chloromethyl ethyl ether was added drop-by-drop, further, 13.15 g (0.130 mole) of triethylamine was diluted with the same amount of NMP and dropped to cause reaction. The solution was added into 3 liter of water, and the precipitate was recovered and washed, then, dried under reduced pressure to obtain a polyimide precursor (P-15). The weight-average molecular weight measured using GPC (column: GL-S300 MDT-5 manufactured by Hitachi Chemical Co., Ltd.) was 22,400, and the ratio of protected acid groups, measured by H-NMR (AMX400 manufactured by BRUKER) was 60%. Thus, it was conformed that there was substantially no amino group at the end of the polymer. From measurement of H-NMR, it was confirmed that about 7% of repeating structures of the polyimide precursor (P-15) were imides of the general formula (II).

10.00 g of the polyimide precursor (P-15), 0.50 g of 4-methoxy-α-[[[(4-methylphenyl)sulfonyl]oxy]imino]benzene acetonitrile, and 0.80 g of a 50% methanol solution of urea propyltriethoxysilane were dissolved while stirring in 16.32 g of γ-butyrolactone. This solution was filtrated under pressure using a Teflon (Registered Trade Mark) filter having 3 µm of pores to obtain a photosensitive polymer composition.

The resulted photosensitive polymer composition was rotation-applied on a silicon wafer using a coater track (Mark VII manufactured by TEL), and dried by heating at 100° C. for 2 minutes on a hot plate, to obtain a coated film of 12.4 µm. This coated film was irradiated with light using an i-line stepper (FPA 3000 iW manufactured by Cannon Inc.) as an exposing machine, via a reticule, while gradually changing the exposure dose from 50 mJ/cm$^2$ to 760 mJ/cm$^2$. Next, heat-treatment was conducted at 100° C. for 2 minutes on a hot plate, then, paddle development was conducted for 30 seconds using a 2.38% by weight aqueous solution of tetramethyl ammonium hydroxide as a developer, and the film was washed with pure water to obtain a relief pattern. This was observed by a metal microscope, and the exposure dose at which a 100 µm square pattern was opened was considered as the sensitivity. It was confirmed that the film thickness of non-exposed area after development was 12.0 µm, the film retention ratio was 97%, and the sensitivity was 120 mJ/cm$^2$. The resulted relief pattern was heat-treated under a nitrogen atmosphere at 320° C. for 1 hour, to obtain a pattern of a polyimide film.

For measurement of the elongation of the polyimide film, a 1 cm×7 cm sample specimen was adjusted so that the film thickness after heat-treatment was 10 µm, and heat-treated at 280° C. and at 320° C. for 1 hour. This was immersed in a 4.9% hydrofluoric acid aqueous solution, and peeled and the elongation was measured by a tensile tester (AGS-H, manufactured by Shimadzu Corp.). The average values at n=4 was 56% and 55%, respectively.

Example 9

Into a 0.5 liter flask equipped with a stirrer, a thermometer, and a Dimroth condenser tube was charged 203.91 g of NMP, and 3.66 g (0.015 mole) of bis(3-amino-4-hydroxyphenyl) hexafluoropropante was dissolved, and to this was added 2.60 g (0.010 mole) of 4,4'-dicarboxy diphenyl ether dichloride (manufactured by Nihon Nohyaku Co., Ltd.) and was reacted. 18.02 g (0.090 mole) of 4,4'-diaminodiphenyl ether was added and dissolved, then, 15.81 g (0.050 mole) of 3,3',4,4'-dicyclohexyl ether tetracarboxylic acid dianhydride was added, and the solution was made to react for 2 hours at room temperature. 2.35 g (0.015 mole) of phenyl chloroformate was added drop-by-drop, then, 12.65 g (0.040 mole) of 3,3', 4,4'-dicyclohexyl ether tetracarboxylic acid dianhydride was added, and the mixture was stirred at room temperature for 6 hours, to obtain an NMP solution of poly(amidic acid-amide). 2.52 g (0.030 mole) of dihydropyrane was added, and the mixture was left overnight. 11.34 g (0.120 mole) of chloromethyl ethyl ether was added drop-by-drop, further, 14.17 g (0.140 mole) of triethylamine was diluted with the same amount of NMP and dropped to cause reaction. The solution was added into 3 liter of water, and the precipitate was recovered and washed, then, dried under reduced pressure to obtain a polyimide precursor (P-16). The weight-average molecular weight was 18,500. P-16 had, from measurement of H-NMR, a ratio of protection in terms of the sum of carboxyl groups and hydroxyl groups of 60%. Thus, it was confirmed that there was substantially no amino group at the end of the polymer, and about 8% of repeating structures of the amidic acid were imides of the general formula (II).

10.00 g of the polyimide precursor (P-16), 0.30 g of N-hydroxynaphthalimide trifluoromethane sulfonate, and 0.80 g of a 50% methanol solution of urea propyltriethoxysilane were dissolved while stirring in 16.32 g of γ-butyrolactone. This solution was filtrated under pressure using a Teflon (Registered Trade Mark) filter having 3 μm of pores to obtain a photosensitive polymer composition.

The resulted photosensitive polymer composition was evaluated in the same manner as in Example 8. It was confirmed that the film retention ratio was 95%, and the sensitivity was 130 mJ/cm$^2$. The resulted relief pattern was heat-treated under a nitrogen atmosphere at 320° C. for 1 hour, to obtain a pattern of a polyimide film. The average values at n=4 with respect to the elongation of the polyimide film was 60% when heat-treated at 280° C. for 1 hour, and 58% when heat-treated at 320° C. for 1 hour.

Example 10

Into a 0.5 liter flask equipped with a stirrer, a thermometer, and a Dimroth condenser tube was charged 233.29 g of NMP, and 18.02 g (0.090 mole) of 4,4'-diamino diphenyl ether and 1.86 g (0.020 mole) of aniline were dissolved, and 35.50 g (0.090 mole) of bis(bicyclo[2.2.1]heptane-2,3-dicarboxylic acid anhydride)sulfone and 2.94 g (0.010 mole) of 3,3',4,4'-dinorbornanesulfonetetracarbocylic acid dianhydride were added, and the mixture was stirred at room temperature for 6 hours to obtain an NMP solution of a polyamic acid. 12.29 g (0.130 mole) of chloromethyl ethyl ether was added drop-by-drop, further, 13.15 g (0.130 mole) of triethylamine was diluted with the same amount of NMP and dropped to cause reaction. The solution was added into 3 liter of water, and the precipitate was recovered and washed, then, dried under reduced pressure to obtain a polyimide precursor (P-17). The weight-average molecular weight was 16,800. P-17 had, from the measurement by H-NMR, it was confirmed that the ratio of protected active groups was 57%, there was substantially no amino group at the end of the polymer, and about 11% of repeating structures of the amidic acid were imides of the general formula (II).

10.00 g of the polyimide precursor (P-17), 0.50 g of diphenyl iodonium 9,10-dimethoxyanthracene-2-sulfonate, and 0.80 g of a 50% methanol solution of urea propyltriethoxysilane were dissolved while stirring in 16.32 g of γ-butyrolactone. This solution was filtrated under pressure using a Teflon (Registered Trade Mark) filter having 3 μm of pores to obtain a photosensitive polymer composition.

The resulted photosensitive polymer composition was evaluated in the same manner as in Example 1. It was confirmed that the film retention ratio was 93%, and the sensitivity was 250 mJ/cm$^2$. The resulted relief pattern was heat-treated under a nitrogen atmosphere at 320° C. for 1 hour, to obtain a pattern of a polyimide film. The average values at n=4 with respect to the elongation of the polyimide film was 48% when heat-treated at 280° C. for 1 hour, and 52% when heat-treated at 320° C. for 1 hour.

Example 11

Into a 0.5 liter flask equipped with a stirrer, a thermometer, and a Dimroth condenser tube was charged 72.06 g of NMP, and 18.02 g (0.060 mole) of 3,3',4,4'-bicyclohexyltetracarboxylic acid dianhydride was dispersed, and 26.68 g (0.0360 mole) of tert-butyl alcohol and 0.91 g (0.006 mole) of 1,8-diazabicyclo[5.4.0]undecene were added, and the mixture was heated to 80° C. and made to react for 20 hours. Then, excess amount of tert-butyl alcohol was distilled off under reduced pressure. The flask was returned to room temperature, and 248.09 g of NMP, 6.02 g (0.080 mole) of 4,4'-diaminodiphenyl ether, 46.00 g (0.120 mole) of diphenyl(2,3-dihydro-2-thioxy-3-benzoxazoyl)phosphonate and 12.14 g (0.120 mole) of triethylamine were added and reacted for 6 hours. Then, 12.01 g (0.040 mole) of 3,3',4,4'-bicyclohexyltetracarboxylic acid dianhydride was added and reacted for 14 hours. The solution was added into water/methanol=1/1, and the precipitate was recovered, and precipitated again using NMP and water/methanol=1/1. A polyimide precursor (P-18) was obtained by washing and drying under reduced pressure which had a weight-average molecular weight of 20,800 and a ratio of protected acid groups, measured by H-NMR, of 51%. Thus, it was confirmed that there was substantially no amino group at the end of the polymer. From measurement of H-NMR, it was also confirmed that about 10% of repeating structures of the polyimide precursor (P-18) were imides of the general formula (II).

10.00 g of the polyimide precursor (P-18), 0.50 g of 4-methoxy-α-[[[(4-methylphenyl)sulfonyl]oxy]imino]benzene acetonitrile, and 0.80 g of a 50% methanol solution of urea propyltriethoxysilane were dissolved while stirring in 16.32 g of γ-butyrolactone. This solution was filtrated under pressure using a Teflon (Registered Trade Mark) filter having 3 μm of pores to obtain a photosensitive polymer composition.

The resulted photosensitive polymer composition was evaluated in the same manner as in Example 8 except that heat-treatment after exposure was conducted for 3 minutes at 120° C. and the development time was changed to 60 seconds. It was confirmed that the film retention ratio was 91%, and the sensitivity was 290 mJ/cm$^2$. The resulted relief pattern was heat-treated under a nitrogen atmosphere at 320° C. for 1 hour, to obtain a pattern of a polyimide film. The average values at n=4 with respect to elongation of the polyimide film was 47% when heat-treated at 280° C. for 1 hour, and 45% when heat-treated at 320° C. for 1 hour.

Comparative Example 1

Into a 0.5 liter flask equipped with a stirrer and a thermometer was charged 36.63 g (0.100 mole) of bis(3-amino-4-hydroxyphenyl)hexafluoropropane and 166.85 g of NMP, and dissolved at room temperature, then, while maintaining the temperature at 0 to 5° C., 176.64 g (equivalent to 0.090 mole) of the NMP solution (α) of diisopropyl 3,3',4,4'-diphenyl ether tetracarboxylate dichloride obtained in Example 1 was added drop-by-drop over 40 minutes, then, stirring thereof was continued for 1 hour. The solution was added into 4 liter of water, and the precipitate was recovered and washed, then, dried under reduced pressure to obtain 67 g of a polyimide precursor (P-5).

50.00 g of the resulted polyimide precursor (P-5) (about 0.139 mole of phenolic hydroxyl group) was charged into a 0.5 liter flask equipped with a stirrer and a thermometer, and to this was added 200.00 g of NMP and dissolved, and 151.63 g (1.803 mole) of 3,4-dihydro-2-pyrane and 2.64 g (0.014 mole) of p-toluenesulfonic acid (monohydrate) were added, and the solution was made to react at room temperature for 2 hours. The solution was added into 4 liter of water, and the precipitate was recovered and washed, then, dried under reduced pressure to obtain a polyimide precursor (P-6). The weight-average molecular weight was 22,900, and the ratio of protected acid groups was 71%, and amino groups were apparently present at the end of the polymer.

10.00 g of the polyimide precursor (P-6), 0.50 g of diphenyl iodonium 9,10-dimethoxyanthracene-2-sulfonate and 0.80 g of a 50% methanol solution of urea propyltriethoxysilane were dissolved while stirring in 16.32 g of γ-butyrolactone. This solution was filtrated under pressure using a Teflon (Registered Trade Mark) filter having 3 μm of pores to obtain a photosensitive polymer composition.

The resulted photosensitive polymer composition was evaluated in the same manner as in Example 1 except that the development time was changed to 420 seconds. It was confirmed that the film retention ratio was 81%, and the sensitivity was 1020 mJ/cm². The resulted relief pattern was heat-treated under a nitrogen atmosphere at 350° C. for 1 hour, to obtain a pattern of a polyimide film.

Comparative Example 2

Into a 0.5 liter flask equipped with a stirrer, a thermometer, and a Dimroth condenser tube was charged 91.60 g of NMP, and 29.42 g (0.100 mole) of 3,3',4,4'-biphenyltetracarbocylic acid dianhydride, 1.11 g (0.015 mole) of n-butanol and 0.30 g (0.003 mole) of triethylamine were added and reacted at 50° C. for 1 hour, and 24.83 g (0.100 mole) of 4,4'-diaminodiphenyl sulfone and 129.86 g of NMP-were added, and reacted at 70° C. for 1 hour, to obtain an NMP solution of a polyamic acid. The solution was left at room temperature for 20 hours, then, the flask was cooled to 0° C., and 13.24 g (0.140 mole) of chloromethyl ethyl ether was added drop-by-drop, then, 14.17 g (0.140 mole) of triethylamine was added drop-by-drop, then, the solution was made to react for 1 hour. The solution was added into 3 liter of water, and the precipitate was recovered and washed, then, dried under reduced pressure to obtain a polyimide precursor (P-9). The weight-average molecular weight was 19,900, and the ratio of protected acid groups was 55%, and amino groups were apparently present at the end of the polymer. From measurement of H-NMR, it was confirmed that about 11% of repeating structures of the polyimide precursor (P-9) were imides of the general formula (II).

10.00 g of the polyimide precursor (P-9), 0.30 g of N-hydroxynaphthalimide trifluoromethane sulfonate and 0.80 g of a 50% methanol solution of urea propyltriethoxysilane were dissolved while stirring in 16.32 g of γ-butyrolactone. This solution was filtrated under pressure using a Teflon (Registered Trade Mark) filter having 3 μm of pores to obtain a photosensitive polymer composition.

The resulted photosensitive polymer composition was evaluated in the same manner as in Example 1 except that the development time was changed to 240 seconds. It was confirmed that the film retention ratio was 89%, and the sensitivity was 1080 mJ/cm².

Comparative Example 3

Into a 0.5 liter flask equipped with a stirrer, a thermometer, and a Dimroth condenser tube was charged 91.60 g of NMP, and 29.42 g (0.100 mole) of 3,3',4,4'-biphenyltetracarbocylic acid dianhydride, 1.14 g (0.015 mole) of glycolic acid and 0.30 g (0.003 mole) of triethylamine were added and reacted at 50° C. for 1 hour, and 24.83 g (0.100 mole) of 4,4'-diaminodiphenyl sulfone and 129.89 g of NMP were added, and reacted at 70° C. for 1 hour, to obtain an NMP solution of a polyamic acid. The solution was left at room temperature for 20 hours, then, the flask was cooled to 0° C., and 13.24 g (0.140 mole) of chloromethyl ethyl ether was added drop-by-drop, then, 14.17 g (0.140 mole) of triethylamine was added drop-by-drop, then, the solution was made to react for 1 hour. The solution was added into 3 liter of water, and the precipitate was recovered and washed, then, dried under reduced pressure to obtain a polyimide precursor (P-10). The weight-average molecular weight was 21,000, and the ratio of protected acid groups was 53%, and amino groups were apparently present at the end of the polymer. From measurement of H-NMR, it was confirmed that about 12% of repeating structures of the polyimide precursor (P-10) were imides of the general formula (II).

10.00 g of the polyimide precursor (P-10), 0.50 g of 4-methoxy-α-[[[(4-methylphenyl)sulfonyl]oxy]imino]benzeneacetonitrile and 0.80 g of a 50% methanol solution of urea propyltriethoxysilane were dissolved while stirring in 16.32 g of γ-butyrolactone. This solution was filtrated under pressure using a Teflon (Registered Trade Mark) filter having 3 μm of pores to obtain a photosensitive polymer composition.

The resulted photosensitive polymer composition was evaluated in the same manner as in Example 1 except that the development time was changed to 140 seconds. It was confirmed that the film retention ratio was 85%, and the sensitivity was 560 mJ/cm².

Comparative Example 4

Into a 1 liter flask equipped with a stirrer, a thermometer, and a Dimroth condenser tube was charged 193.64 g of N-methyl-2-pyrrolidone and 48.4 g of xylene, and to this was added 36.63 g (0.100 mole) of bis(3-amino-4-hydroxyphenyl) hexafluoropropane, and the mixture was dissolved by stirring, then, 27.92 g (0.090 mole) of 3,3',4,4'-biphenyl ether tetracarboxylic acid dianhydride was added, and stirring thereof was continued for 6 hours, to obtain a polyamic acid solution.

Next, the flask was installed to a water content measuring apparatus, and heated at 160° C. for 2 hours, and water produced by an imidation reaction was removed by azeotropic distillation with xylene, to obtain a polyimide solution. To this was added 197.52 g (2.739 mole) of vinyl ethyl ether and 4.01 g (0.021 mole) of p-toluenesulfonic acid (monohydrate), and the solution was made to react at room temperature for 5 hours. The solution was added into 5 liter of water, and the precipitate was recovered and washed, then, dried under reduced pressure to obtain a polyimide precursor (P-19). The weight-average molecular weight was 20,500, and the ratio of protected acid groups was 55%, and there was substantially no amino group at the end of the polymer.

10.00 g of the polyimide precursor (P-19), 0.50 g of p-nitrobenzyl-9,10-dimethoxyanthracene-2-sulfonate and 0.80 g of a 50% methanol solution of urea propyltriethoxysilane were dissolved while stirring into a mixed solution of 11.42 g of γ-butyrolactone and 4.90 g of N-methylpyrrolidone. This solution was filtrated under pressure using a Teflon (Registered Trade Mark) filter having 3 μm of pores to obtain a photosensitive polymer composition.

The resulted photosensitive polymer composition was evaluated in the same manner as in Example 1 except that the development time was changed to 480 seconds. It was confirmed that the film retention ratio was 92%, and the sensitivity was 1240 mJ/cm$^2$. The resulted relief pattern was heat-treated under a nitrogen atmosphere at 350° C. for 1 hour, to obtain a pattern of a polyimide film.

Comparative Example 5

Into a 0.5 liter flask equipped with a stirrer, a thermometer, and a Dimroth condenser tube was charged 136.54 g of NMP, and 24.02 g (0.080 mole) of 3,3',4,4'-bicyclohexyltetracarboxylic acid dianhydride was added and dispersed, then, heated at 70° C., and a solution prepared by dissolving 20.02 g (0.100 mole) of 4,4'-diaminodiphenyl ether into 55.06 g of NMP was added drop-by-drop over 1 hour. When the solution became approximately transparent during the dropping, the remaining 4,4'-diaminodiphenyl ether solution was added in one time, to obtain an NMP solution of a polyamic acid. The solution was left at room temperature for 20 hours, then, 9.83 g (0.104 mole) of chloromethyl ethyl ether was added drop-by-drop, further, 10.52 g (0.104 mole) of triethylamine was diluted with the same amount of NMP and dropped to cause reaction thereof. The solution was added into 3 liter of water, and the precipitate was recovered and washed, then, dried under reduced pressure to obtain a polyimide precursor (P-20). The weight-average molecular weight was 25,500, and the ratio of protected acid groups, measured by H-NMR, was 50%, and there was substantially no amino group at the end of the polymer. From measurement of H-NMR, it was confirmed that about 8% of repeating structures of the polyimide precursor (P-20) were imides of the general formula (II).

10.00 g of the polyimide precursor (P-20), 0.50 g of 4-methoxy-α-[[[(4-methylphenyl)sulfonyl]oxy]imino]benzeneacetonitrile and 0.80 g of a 50% methanol solution of urea propyltriethoxysilane were dissolved while stirring in 16.32 g of γ-butyrolactone. This solution was filtrated under pressure using a Teflon (Registered Trade Mark) filter having 3 μm of pores to obtain a photosensitive polymer composition.

The resulted photosensitive polymer composition was evaluated in the same manner as in Example 8. It was confirmed that the film retention ratio was 94%, and the sensitivity was 580 mJ/cm$^2$.

Comparative Example 6

Into a 0.5 liter flask equipped with a stirrer, a thermometer, and a Dimroth condenser tube was charged 131.74 g of NMP, and 24.83 g (0.100 mole) of 4,4'-diaminodiphenyl sulfone was added and dissolved while stirring, then, the flask was cooled to 0° C., and 1.63 g (0.015 mole) of phenyl chlorocarbonate was added drop-by-drop, then, 1.72 g (0.017 mole) of triethylamine was added drop-by-drop, and the solution was made to react for 1 hour. Then, 17.65 of (0.060 mole) of 3,3',4,4'-biphenyltetracarboxylic acid dianhydride was added and 12.41 g (0.040 mole) of 3,3',4,4'-biphenyl ether tetracarboxylic acid dianhydride were added, and reacted at 70° C. for 1 hour, to obtain an NMP solution of a polyamic acid. The solution was left at room temperature for 20 hours, then, the flask was cooled to 0° C., and 12.29 g (0.130 mole) of chloromethyl ethyl ether was added drop-by-drop, then, 13.15 g (0.130 mole) of triethylamine was added drop-by-drop, then, the solution was made to react for 1 hour. The solution was added into 3 liter of water, and the precipitate was recovered and washed, then, dried under reduced pressure to obtain a polyimide precursor (P-21). The weight-average molecular weight was 17,700, and the ratio of protected acid groups was 52%, and there was substantially no amino group at the end of the polymer. From measurement of H-NMR, it was confirmed that about 13% of repeating structures of the polyimide precursor (P-21) were imides of the general formula (II).

10.00 g of the polyimide-precursor (P-21), 0.30 g of N-hydroxynaphthalimide trifluoromethane sulfonate and 0.80 g of a 50% methanol solution of urea propyltriethoxysilane were dissolved while stirring in 16.32 g of γ-butyrolactone. This solution was filtrated under pressure using a Teflon (Registered Trade Mark) filter having 3 μm of pores to obtain a photosensitive polymer composition.

The resulted photosensitive polymer composition was evaluated in the same manner as in Example 8 except that heat-treatment after exposure was conducted at 120° C. for 3 minutes and the development time was changed to 100 seconds. It was confirmed that the film retention ratio was 89%, and the sensitivity was 190 mJ/cm$^2$. The resulted relief pattern was heat-treated under a nitrogen atmosphere at 320° C. for 1 hour, to obtain a pattern of a polyimide film. The average values at n=4 with respect to elongation of the polyimide film was 11% when heat-treated at 280° C. for 1 hour, and 37% when heat-treated at 320° C. for 1 hour.

Comparative Example 7

Into a 0.5 liter flask equipped with a stirrer, a thermometer, and a Dimroth condenser tube was charged 155.16 g of NMP, and 30.03 g (0.100 mole) of 3,3',4,4'-bicyclohexyltetracarboxylic acid dianhydride was added and dispersed, then, the solution was heated to 70° C. To this, a solution prepared by reacting 20.02 g (0.100 mole) of 4,4'-diaminodiphenyl ether and 2.46 g (0.015 mole) of 5-norbornene-2,3-dicarboxylic acid anhydride with 62.56 g of NMP for 6 hours was added over 1 hour, to obtain an NMP solution of a polyamic acid. The solution was left at room temperature for 20 hours, then, 12.29 g (0.130 mole) of chloromethyl ethyl ether was added drop-by-drop, then, 13.15 g (0.130 mole) of triethylamine was diluted with the same amount of NMP and dropped, then, the solution was made to react. The solution was added into 3 liter of water, and the precipitate was recovered and washed, then, dried under reduced pressure to obtain a polyimide precursor.(P-22). The weight-average molecular weight was 23,700.

10.00 g of the polyimide precursor (P-22), 0.50 g of 4-methoxy-α-[[[(4-methylphenyl)sulfonyl]oxy]imino]benzeneacetonitrile and 0.80 g of a 50% methanol solution of urea propyltriethoxysilane were dissolved while stirring in 16.32 g of γ-butyrolactone. This solution was filtrated under pressure using a Teflon (Registered Trade Mark) filter having 3 μm of pores to obtain a photosensitive polymer composition.

The resulted photosensitive polymer composition was evaluated in the same manner as in Example 8 except that the development time was changed to 60 seconds. It was confirmed that the film retention ratio was 92%, and the sensitivity was 570 mJ/cm$^2$.

The positive-tone photosensitive polymer composition of the present invention can be developed with an alkali aqueous solution and shows excellent sensitivity even if the film thickness is large. Further, the positive-tone photosensitive polymer composition of the present invention can be developed with an alkali aqueous solution, shows excellent sensitivity, and manifests excellent elongation even if the temperature of heat-treatment into a polyimide is lowered.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A photosensitive polymer composition, comprising:
   (a) a polymer selected from (i) polyimide precursors that contain repeating units of the following general formula (III):

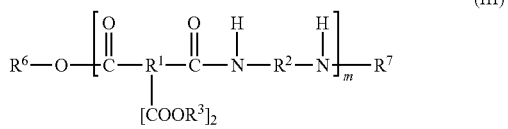

where $R^1$ represents a tetra-valent organic group, $R^2$ represents a di-valent organic group, two $R^3$s represent each independently a hydrogen atom or a mono-valent organic group, $R^6$ represents a hydrogen atom or a mono-valent organic group, and $R^7$ represents a mono-valent organic group, and m represents an integer of 1 or more, wherein the polyimide precursors have substantially no amino group (—NH$_2$) at any end thereof, and wherein one or more of $R^1$, $R^2$ and $COOR^3$ contains a protected acid group and an acid-protecting group therefor, and
   (ii) polyimides having substantially no amino group (—NH$_2$) at the end, and having repeating units of the following general formula (IV):

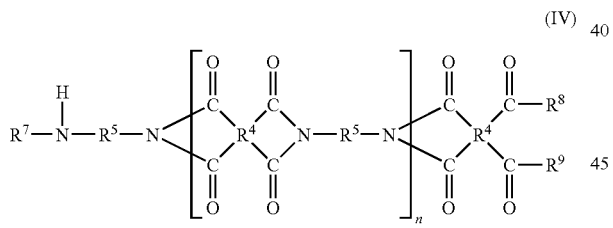

where $R^4$ represents a tetra-valent organic group, and $R^5$ represents a di-valent organic group, wherein one or more of $R^4$ and $R^5$ contains a protected acid group and an acid-protecting group therefor, and $R^8$ and $R^9$ represent a hydroxy group or a mono-valent alkoxy group or $R^8$ and $R^9$ represent that they are bonded to form —O—, and n represents an integer of 1 or more,
   wherein the polymer has no group capable of forming a cross-linkage into a polyimide during heat-treatment at any end thereof; and
   (b) a compound that generates an acid when exposed to light and is capable of detaching the acid-protecting group from the protected acid group,
   wherein at least some of the ends of the component (a) are composed of a protected amino group with an end-protecting group, wherein said end-protecting group can be detached from the protected amino group by heat-treatment at 400° C. or less.

2. The photosensitive polymer composition according to claim 1, wherein the protected amino group and the end-protecting group therefor constitute an organic group selected from organic groups of the general formulae (V) to (VII):

where $R^{10}$ represents a mono-valent organic group,

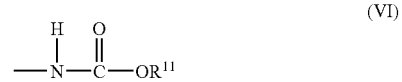

where $R^{11}$ represents a mono-valent organic group, and

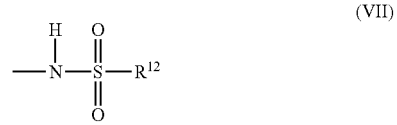

where $R^{12}$ represents a mono-valent organic group.

3. The photosensitive polymer composition according to claim 1, wherein the acid group and the acid-protecting group therefor constitute a group containing a moiety selected from the group consisting of a tetrahydropyranyl group, alkoxymethyl group, alkoxyethyl group, tert-butoxycarbonyl group, and tert-butyl ester group.

4. A method of forming a relief pattern, comprising:
   applying the photosensitive polymer composition of claim 1 on a substrate to thereby form a film of the photosensitive polymer composition on the substrate;
   drying the film;
   exposing the film to light;
   heating, if necessary, the film;
   developing the film; and
   curing the film.

5. The method according to claim 4, wherein the film is exposed to i-line at the exposing.

6. An electronic equipment including an electronic device, the electronic device having at least an interlayer insulating film layer and a passivation film layer, wherein at least one of the interlayer insulating film layer and the passivation film layer is formed with the relief pattern by the method of claim 4.

7. The photosensitive polymer composition according to claim 1, wherein the protected acid group and the acid-protecting group constitute a protected carboxylic group or a protected phenolic hydroxyl group.

8. The photosensitive polymer composition according to claim 1, wherein all the ends of the component (a) are composed of the protected amino group with the end-protecting group.

9. The photosensitive polymer composition according to claim 1, wherein $R^1$ and $R^4$ are each independently a tetra-valent aromatic group.

* * * * *